United States Patent
Chang et al.

(10) Patent No.: US 12,424,257 B2
(45) Date of Patent: Sep. 23, 2025

(54) MEMORY DEVICES WITH DUAL-SIDE ACCESS CIRCUITS AND METHODS FOR OPERATING THE SAME

(71) Applicant: Taiwan Semiconductor Manufacturing Company, Ltd., Hsinchu (TW)

(72) Inventors: Tung-Cheng Chang, Hsinchu (TW); Yu-Fan Lin, Hsinchu (TW); Ku-Feng Lin, Hsinchu (TW); Perng-Fei Yuh, Hsinchu (TW); Yih Wang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 125 days.

(21) Appl. No.: 18/405,940

(22) Filed: Jan. 5, 2024

(65) Prior Publication Data

US 2025/0111869 A1    Apr. 3, 2025

Related U.S. Application Data

(60) Provisional application No. 63/611,319, filed on Dec. 18, 2023, provisional application No. 63/586,495, filed on Sep. 29, 2023.

(51) Int. Cl.
*G11C 11/16*    (2006.01)

(52) U.S. Cl.
CPC ........ *G11C 11/1659* (2013.01); *G11C 11/161* (2013.01); *G11C 11/1653* (2013.01); *G11C 11/1675* (2013.01)

(58) Field of Classification Search
CPC ..................................................... G11C 11/16
See application file for complete search history.

(56) References Cited

U.S. PATENT DOCUMENTS

| 10,224,087 B1 | 3/2019 | Jung et al. |
| 2006/0083050 A1 | 4/2006 | Perner |
| 2012/0044736 A1* | 2/2012 | Chung ............... G11C 13/0069 365/72 |

FOREIGN PATENT DOCUMENTS

KR    10-2012-0130096 A    11/2012

OTHER PUBLICATIONS

Office Action issued in Korean Appl. No. 10-2024-0123188 dated May 28, 2025.

(Continued)

*Primary Examiner* — Jason Lappas
(74) *Attorney, Agent, or Firm* — FOLEY & LARDNER LLP

(57) ABSTRACT

A memory circuit includes a memory array comprising a plurality of non-volatile memory cells, wherein the non-volatile memory cells are arranged along a plurality of access lines that extend along a lateral direction. The memory circuit includes a first access circuit physically disposed on a first side of the memory array in the lateral direction. The memory circuit includes a second access circuit physically disposed on a second side of the memory array in the lateral direction, the second side being opposite to the first side. When each of the non-volatile memory cells is configured to be programmed by at least a first current and a second current, the first current and second current flow through a first path and a second path, respectively. The first path at least comprises a portion on the first side and the second path at least comprises a portion on the second side.

20 Claims, 13 Drawing Sheets

(56) References Cited

OTHER PUBLICATIONS

Office Action issued in connection with Taiwan Appl. No. 113113878 dated Dec. 18, 2024.

* cited by examiner

MEMORY DEVICES WITH DUAL-SIDE ACCESS CIRCUITS AND METHODS FOR OPERATING THE SAME

CROSS-REFERENCE TO RELATED APPLICATION

This application claims priority to and the benefit of both of U.S. Provisional Application No. 63/586,495, filed Sep. 29, 2023, and U.S. Provisional Application No. 63/611,319, filed Dec. 12, 2023, both of which are incorporated herein by reference in their entireties for all purposes.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRA WINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
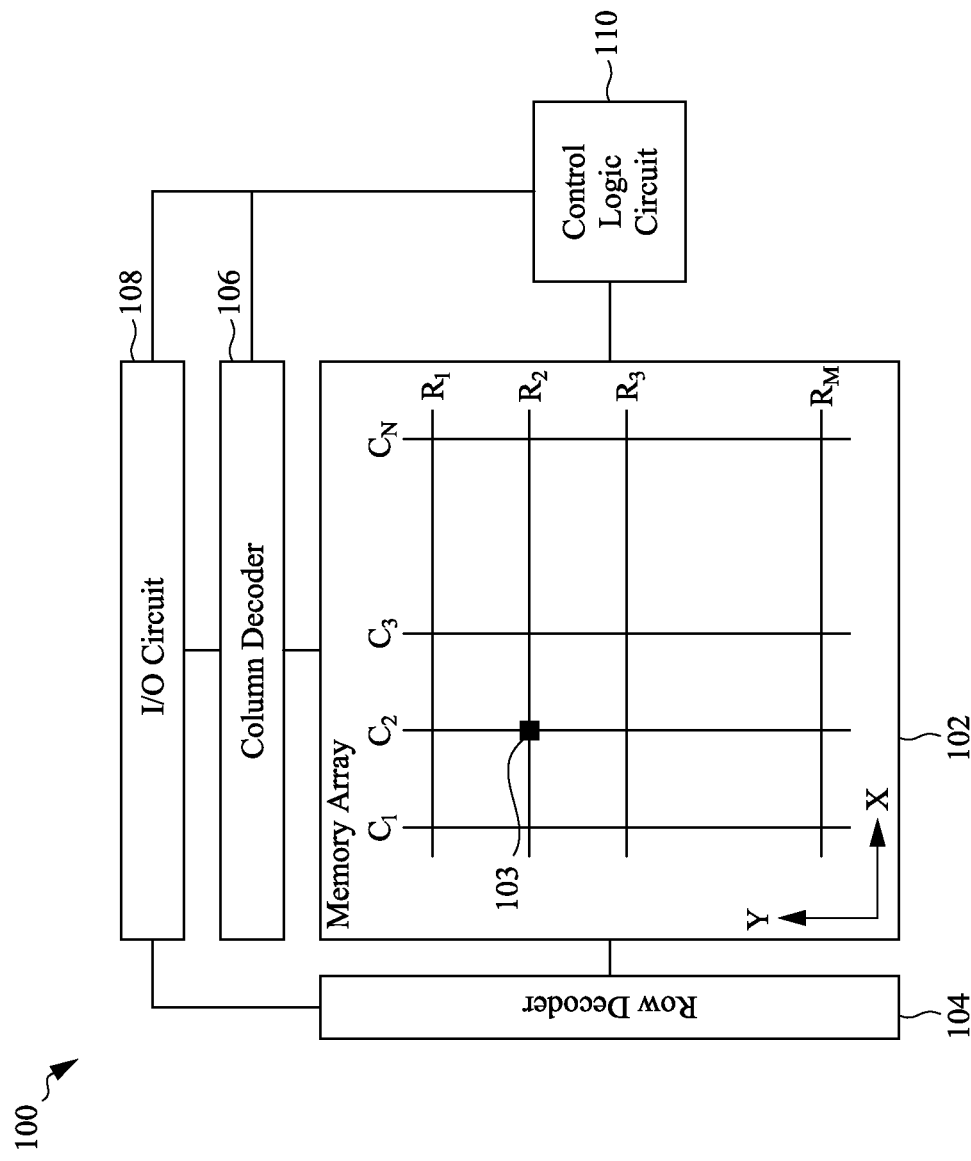
FIG. 1 illustrates a block diagram of a memory device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Many modern electronic devices contain memory devices. Memory devices generally include volatile memory devices or non-volatile memory devices. The non-volatile memory device can retain its stored data in the absence of power, whereas the volatile memory device loses its data memory contents when power is lost. A magnetoresistive random-access memory (MRAM) device is one promising candidate for the next generation of non-volatile electronic memory devices due to advantages over current electronic memory devices. Compared to the current non-volatile memory devices, such as flash random-access memory devices, an MRAM device typically is faster and has better endurance. Compared to the current volatile memory devices, such as dynamic random-access memory (DRAM) devices and static random-access memory (SRAM) devices, the MRAM device typically has similar performance and density, but lower power consumption.

In general, an MRAM device includes a plural number of MRAM cells formed as a memory array. The MRAM cell may include a magnetic tunnel junction (MTJ) arranged between conductive electrodes (e.g., upper and lower electrodes). The MTJ may include a pinned layer separated from a free layer by a tunnel barrier layer. A magnetic orientation of the pinned layer is static (i.e., fixed), while a magnetic orientation of the free layer can switch between a parallel configuration and an anti-parallel configuration with respect to that of the pinned layer. The parallel configuration provides for a low resistive state that digitally stores data as a first data state (e.g., a logic "1"). The anti-parallel configuration provides for a high resistive state that digitally stores data as a second data state (e.g., a logic "0").

Each MRAM cell of the memory array can be programmed through the respective upper and lower electrodes. Further, to achieve different data states, a programming voltage can be applied to an MRAM cell through a corresponding bit line that is connected to the upper electrodes with the lower electrode coupled to ground, or through a corresponding source line connected to the lower electrode with the upper electrode coupled to ground. Accordingly, currents may be conducted through the MRAM cell in opposite directions. For example, a first current can flow through a first path extending from the bit line, through the MRAM cell, and to the source line to write a first data state; and a second current can flow through a second path extending form the source line, through the MRAM cell, and to the bit line to write a second data state. Such a programming voltage is typically provided or passed by a driver circuit that is operatively coupled to and physically disposed next to the memory array, and the generated current typically flows to ground by a pull-down circuit that is also operatively coupled to and physically disposed next to the memory array.

In the existing technologies, the driver circuit and the pull-down circuit are typically formed on a same side of the memory array. As a size of the memory array becomes large (e.g., with an increased number of word lines/an increased length of bit lines), the MRAM cells that are formed farther from the driver circuit and the pull-down circuit commonly suffer insufficient programming voltage, mainly due to an increased voltage (IR) drop present along the extended bit lines. To this end, some technologies have proposed to place the driver circuit and the pull-down circuit on the opposite sides of a memory array. Stated another way, regardless of the current flow direction, a programming voltage is applied on one side of the memory array (through a driver circuit) and a generated current flows to ground on the other side of the memory array (through a pull-down circuit). However, the electrodes of each of the MRAM cells are typically coupled to or formed as metal lines. With the increasingly shrunken dimensions of the technology nodes, dimensions of these metal lines shrink accordingly. As such, the metal lines (or a corresponding write path) may present a higher resistance, which leads to the voltage drop issues remaining unsolved. Therefore, the existing MRAM devices have not been entirely satisfactory in certain aspects.

The present disclosure provides various embodiments of a memory device or circuit including a memory array, with one or more driver circuits and one or more pull-down circuits physically formed on a same side of the memory array having a number of memory cells. In one aspect of the present disclosure, the memory device includes one driver circuit disposed on a first side of the memory array, and two pull-down circuits disposed on the first side and a second side of the memory array, respectively. In another aspect of the present disclosure, the memory device includes two driver circuits disposed on the first side and the second side of the memory array, respectively, and one pull-down circuit disposed on the first or second side of the memory array. In yet another aspect of the present disclosure, the memory device includes two driver circuits disposed on the first side and the second side of the memory array, respectively, and two pull-down circuits disposed on the first side and the second side of the memory array, respectively. Accordingly, each memory cell of the memory array can be programmed via at least a first current and a second current that can flow in respectively different directions. As such, the equivalent resistance of a conduction (e.g., programming or reading) path across any of the memory cells can be significantly reduced, which can advantageously increase a write/read margin of the disclosed memory device.

FIG. 1 illustrates a block diagram of a memory device 100, in accordance with various embodiments of the present disclosure. In the illustrated embodiment of FIG. 1, the memory device 100 includes a memory array 102, a row decoder 104, a column decoder 106, an input/output (I/O)) circuit 108, and a control logic circuit 110. Despite not being shown in FIG. 1, all of the components of the memory device 100 may be coupled to each other and to the control logic circuit 110. Although, in the illustrated embodiment of FIG. 1, each component is shown as a separate block for the purpose of clear illustration, in some other embodiments, some or all of the components shown in FIG. 1 may be integrated together. For example, the memory array 102 may include an embedded I/O circuit (e.g., 108).

The memory array 102 is a hardware component that stores data. In various embodiments, the memory array 102 is embodied as a semiconductor memory device. The memory array 102 includes a plurality of memory cells (or otherwise storage units) 103. The memory array 102 includes a number of rows $R_1, R_2, R_3 \ldots R_M$, each extending in a first direction (e.g., the X-direction) and a number of columns $C_1, C_2, C_3 \ldots C_N$, each extending in a second direction (e.g., the Y-direction). Each of the rows and columns may include one or more conductive (e.g., metal) structures functioning as access lines. Each memory cell 103 is arranged in the intersection of a corresponding row and a corresponding column, and can be operated according to voltages or currents through the respective conductive structures of the column and row. For example, each of the rows may include one or more corresponding word lines (WLs), and each of the columns may include one or more corresponding bit line (BLs) and one or more source lines (SLs).

In some embodiments, each memory cell 103 is embodied as an MRAM cell, the detail of which will be discussed in FIG. 2. However, it should be understood that the memory array 102 can include any of various other non-volatile memory cells such as, for example, spin-transfer torque random-access memory (STT-RAM) cells, ferroelectric random-access memory (FeRAM) cells, resistive random-access memory (RRAM) cells, phase-change random-access memory (PCRAM) cells, etc., while remaining within the scope of the present disclosure.

The row decoder 104 is a hardware component that can receive a row address of the memory array 102 and assert a conductive structure (e.g., the WL) at that row address. The column decoder 106 is a hardware component that can receive a column address of the memory array 102 and assert a conductive structure (e.g., the BL and SL) at that column address. The I/O circuit 108 is a hardware component that can access (e.g., read, program) each of the memory cells 103 asserted through the row decoder 104 and column decoder 106. The control logic circuit 110 is a hardware component that can control the coupled components (e.g., 102 through 108).

It should be appreciated that the arrangements of the components shown in FIG. 1 is merely for illustrative purposes and does not limit the physical layout of these components. For example, although the I/O circuit 108 is shown as being arranged on a first side of the memory array 102, the I/O circuit 108 can include multiple sub-components or sub-circuits (e.g., one or more driver circuits, one or more pull-down circuits) physically disposed on different sides of the memory array 102, in accordance with various embodiments of the present disclosure. Further, such sub-components can be physically disposed between the column decoder 106 and the memory array 102. In some embodiments, the driver circuits and the pull-down circuits may sometimes be referred to as access circuits.

Figure 2:
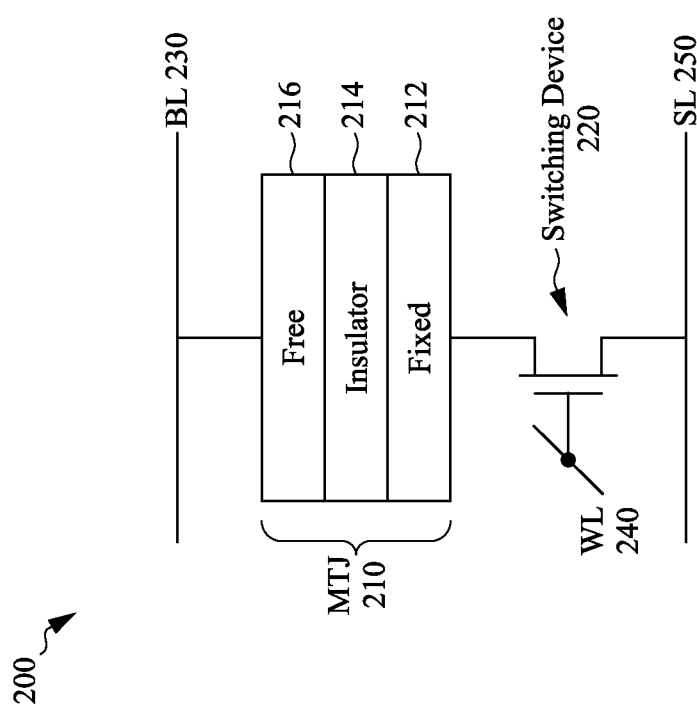
FIG. 2 illustrates a schematic diagram of a memory cell of the memory device, in accordance with some embodiments.

FIG. 2 illustrates a schematic diagram of an MRAM cell 200, in accordance with various embodiments of the present disclosure. The MRAM cell 200 can be an implementation of the memory cell 103 of FIG. 1. The MRAM cell 200 includes a magnetic memory element such as a MTJ device 210 and a switching device 220. In the present disclosure, the MTJ device 210 may sometimes be referred to as a memory cell. The MTJ device 210 includes a fixed or pinned layer 212, a tunneling barrier layer or insulator layer 214, and a free layer 216. The magnetization of the free layer 216 is free to rotate to point in one of two directions. For the fixed layer 212, an anti-ferromagnetic layer may be used to fix, or pin, its magnetization in a particular direction. The insulator layer 214 is sandwiched between the free layer 216 and the fixed layer 212. The free layer 216 is connected to a bit line (BL) 230 which provides the free layer with a voltage in a read or write operation. The fixed layer 212 is connected to the drain of the switching device 220.

The switching device 220 is configured to read from, or write to the MTJ device 210. Example embodiments of the switching device 220 include a metal oxide semiconductor (MOS) transistor, an MOS diode, and/or a bipolar transistor. The gate of the switching device 220 is connected to a word line (WL) 240, which may activate the memory cell for a read or write operation. In some other embodiments, the WL 240 may include a read WL and a write WL, where the read WL is activated for a read operation and the write WL is activated for a write operation. The source of the switching device 220 is connected to a source line (SL) 250, which may drive the fixed layer 212 with a voltage in a read or write operation when activated by the WL 240. The SL 250 may include a common source line (CSL) which may be connected to a plurality of memory cells (e.g., 103) that are connected to the same WL 240. A controller (e.g., the control logic circuit 110) may provide a turn-on voltage (e.g., $V_{DD}$ or $V_{CC}$) to the WL 240.

Data in the MTJ device 210 is represented by the magnetization direction of the free layer 216 relative to the fixed layer 212. For example, when the magnetization of the free layer 216 and the fixed layer 212 are programmed to be parallel ("P") and the magnetic moments have the same polarity, the MTJ device 210 may present a low resistance. When the magnetization of the free layer 216 and the fixed layer 212 are programmed to be anti-parallel ("AP") and the magnetic moments have the opposite polarity, the MTJ device 210 may present a high resistance. During a read operation of the MRAM cell 200, a current may be flow from the SL 250 to the BL 230. When the resistance of the MTJ device 210 is low or the magnetization of the free layer 216 and the fixed layer 212 are parallel, the current flowing through the MRAM cell 200 may be high (sometimes referred to as a logic 0 state). When the resistance of the MTJ device 210 is high or the magnetization of the free layer 216 and the fixed layer 212 are anti-parallel, the current flowing through the MRAM cell 200 may be low (sometimes referred to as a logic 1 state).

The current flowing from the BL 230 may be provided to a sense amplifier that can compare the sense amplifier to a reference current from a reference cell. The reference cell may have a resistance that is an average of the two different states of the MTJ device 210. For example, the resistance of a reference cell may be set to the average of a parallel state and an anti-parallel state. The sense amplifier can then compare a current output of the MTJ device 210 against the current output of the reference cell. If the current output of the MTJ device 210 is less than the reference cell, that means the resistance in the MTJ device 210 is high, and a logic 1 state is read from the MTJ device 210. If the current output of the MTJ device 210 is greater than the reference cell, that means the resistance in the MTJ device 210 is low, and a logic 0 state is read from the MTJ device 210.

Figure 3:
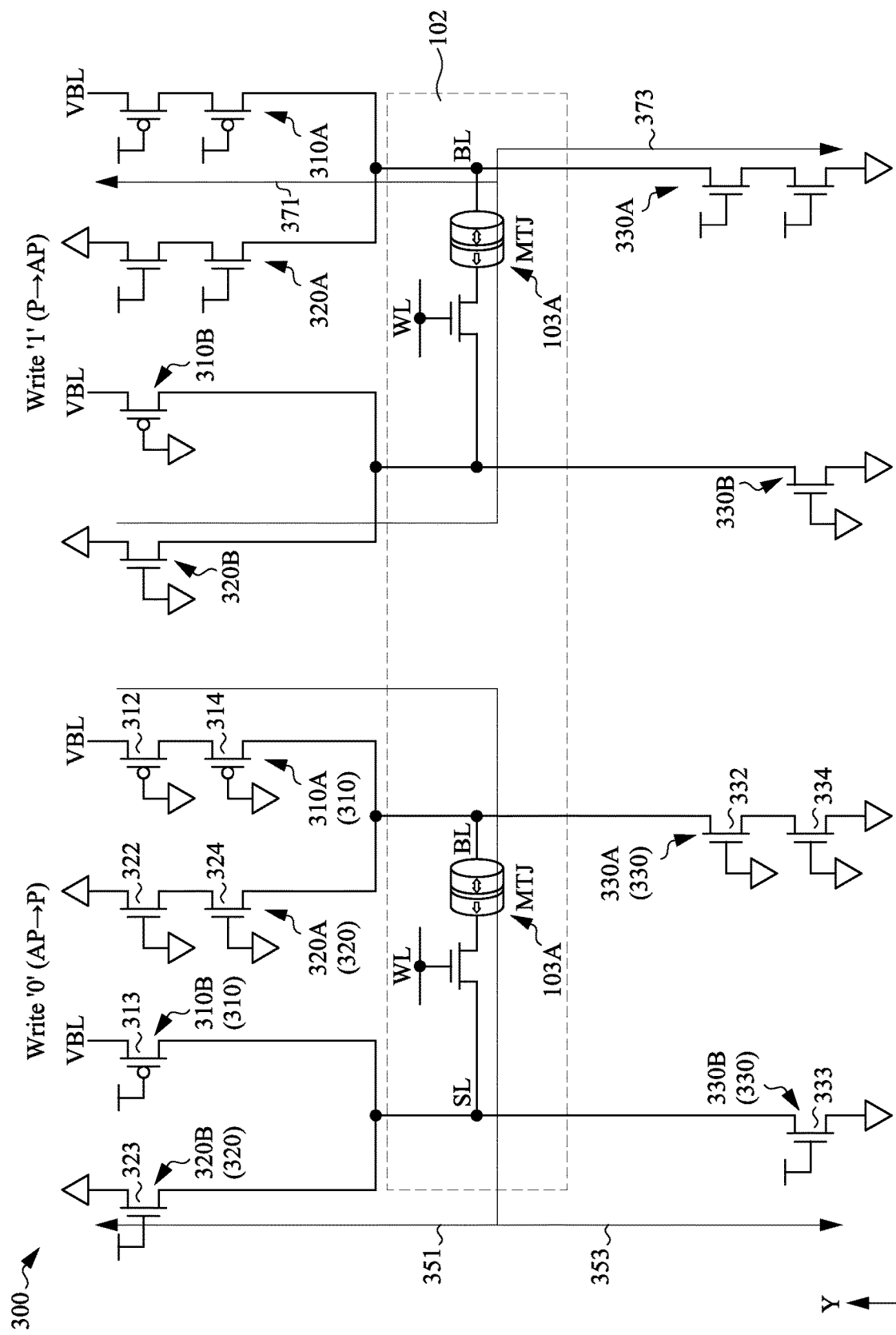
FIG. 3 illustrates an example schematic diagram of a portion of the memory device of FIG. 1 which includes plural access circuits physically disposed on the opposite sides of a memory array, in accordance with some embodiments.

FIG. 3 illustrates an example schematic diagram 300 of a portion of the memory device 100 shown in FIG. 1 (hereinafter "memory device 300"), in accordance with some embodiments of the present disclosure. As a brief overview, the memory device 300 includes one driver circuit and a first pull-down circuit disposed on a first side of the memory array 102, and a second pull-down circuit disposed on a second, opposite side of the memory array 102. One memory cell (e.g., 103A), implemented as the MRAM cell 200 (FIG. 2), is shown in the memory array 102. In some embodiments, the driver circuit and the pull-down circuits may be a part of the I/O circuit 108. The memory device 300 of FIG. 3 is simplified for illustrative purposes, and thus, it should be understood that some components of FIG. 1 may be omitted in FIG. 3.

As shown, the memory device 300 includes driver circuit 310, first pull-down circuit 320, and second pull-down circuit 330. The driver circuit 310 and the first pull-down circuit 320 are physically disposed (or otherwise formed) on a first side of the memory array 102, e.g., along the Y-direction, and the second pull-down circuit 330 is physically disposed on a second side of the memory array 102, e.g., along the Y-direction, in accordance with some embodiments. Further, the driver circuit 310 includes sub-circuits 310A and 310B; the first pull-down circuit 320 includes sub-circuits 320A and 320B; and the second pull-down circuit 330 includes sub-circuits 330A and 330B.

In some embodiments, the sub-circuit 310A of the driver circuit 310 includes two p-type transistors 312 and 314 connected to each other in series; the sub-circuit 310B of the driver circuit 310 includes one p-type transistor 313; the sub-circuit 320A of the first pull-down circuit 320 includes two n-type transistors 322 and 324 connected to each other in series; the sub-circuit 320B of the first pull-down circuit 320 includes one n-type transistor 324; the sub-circuit 330A of the second pull-down circuit 330 includes two n-type transistors 332 and 334 connected to each other in series; and the sub-circuit 330B of the second pull-down circuit 330 includes one n-type transistor 334. The sub-circuits 310A and 310B of the driver circuit 310 are each configured to selectively couple a programming voltage (e.g., $V_{BL}$) to the memory cell 103A through the BL or SL, while the sub-circuits 320A and 320B of the first pull-down circuit 320 and the sub-circuits 330A and 330B of the second pull-down circuit 330 are each configured to selectively couple the memory cell 103A to ground through the BL or SL.

The p-type transistors 312 to 313 of the driver circuit 310 are gated (e.g., activated) by respective control signals to couple the programming voltage to the memory cell 103A. For example, the p-type transistors 312 to 313 may each be turned on in response to the corresponding control signal being asserted to a logic low state. The n-type transistors 322 to 324 of the first pull-down circuit 320 are gated (e.g., activated) by respective control signals to couple the memory cell 103A to ground. Similarly, the n-type transistors 332 to 334 of the second pull-down circuit 330 are gated (e.g., activated) by respective control signals to couple the memory cell 103A to ground. For example, the n-type transistors 322 to 324 and 332 to 334 may each be turned on in response to the corresponding control signal being asserted to a logic high state. In some embodiments, respective logic states of these control signals may be configured based on a logic state to be programmed into the memory cell 103A.

In some embodiments, the sub-circuit 310A and the sub-circuit 310B of the driver circuit 310 can be alternately activated (e.g., with the transistors 312 and 314 concurrently turned on and the transistor 313 turned off) to couple the programming voltage to the memory cell 103A; the sub-circuit 320A and the sub-circuit 320B of the first pull-down circuit 320 can be alternately activated (e.g., with the transistors 322 and 324 concurrently turned off and the transistor 324 turned on) to couple the memory cell 103A to ground; and the sub-circuit 330A and the sub-circuit 330B of the second pull-down circuit 330 can be alternately activated (e.g., with the transistors 332 and 334 concurrently turned on and the transistor 334 turned off) to couple the memory cell 103A to ground.

For example, to program a logic 0 to the memory cell 103A (from the AP state to the P state), the sub-circuits 310A, 320B, and 330B are activated, while the sub-circuits 310B, 320A, and 330A are deactivated. As such, the programming voltage can be coupled to the memory cell 103A through the BL (and the sub-circuit 310A), and the memory cell 103A can be coupled to ground through the SL (and the sub-circuits 320B and 330B, respectively). Equivalently, two conduction paths 351 and 353 can flow through the memory cell 103A. The conduction path 351 extends from the sub-circuit 310A, through the memory cell 103A and the sub-circuit 320B, and to ground; and the conduction path 353 extends from the sub-circuit 310A, through the memory cell 103A and the sub-circuit 330B, and to ground. Stated another way, the conduction path 351 extends from the first side of the memory array 102 to the first side of the memory array 102, while the conduction path 353 extends from the first side of the memory array 102 to the second side of the memory array 102.

In another example, to program a logic 1 to the memory cell 103A (from the P state to the AP state), the sub-circuits 310B, 320A, and 330A are activated, while the sub-circuits 310A, 320B, and 330B are deactivated. As such, the programming voltage can be coupled to the memory cell 103A through the SL (and the sub-circuit 310B), and the memory cell 103A can be coupled to ground through the BL (and the sub-circuits 320A and 330A, respectively). Equivalently, two conduction paths 371 and 373 can flow through the memory cell 103A. The conduction path 371 extends from the sub-circuit 310B, through the memory cell 103A and the sub-circuit 320A, and to ground; and the conduction path 373 extends from the sub-circuit 310B, through the memory cell 103A and the sub-circuit 330A, and to ground. Stated another way, the conduction path 371 extends from the first side of the memory array 102 to the first side of the memory array 102, while the conduction path 373 extends from the first side of the memory array 102 to the second side of the memory array 102.

Figure 4:
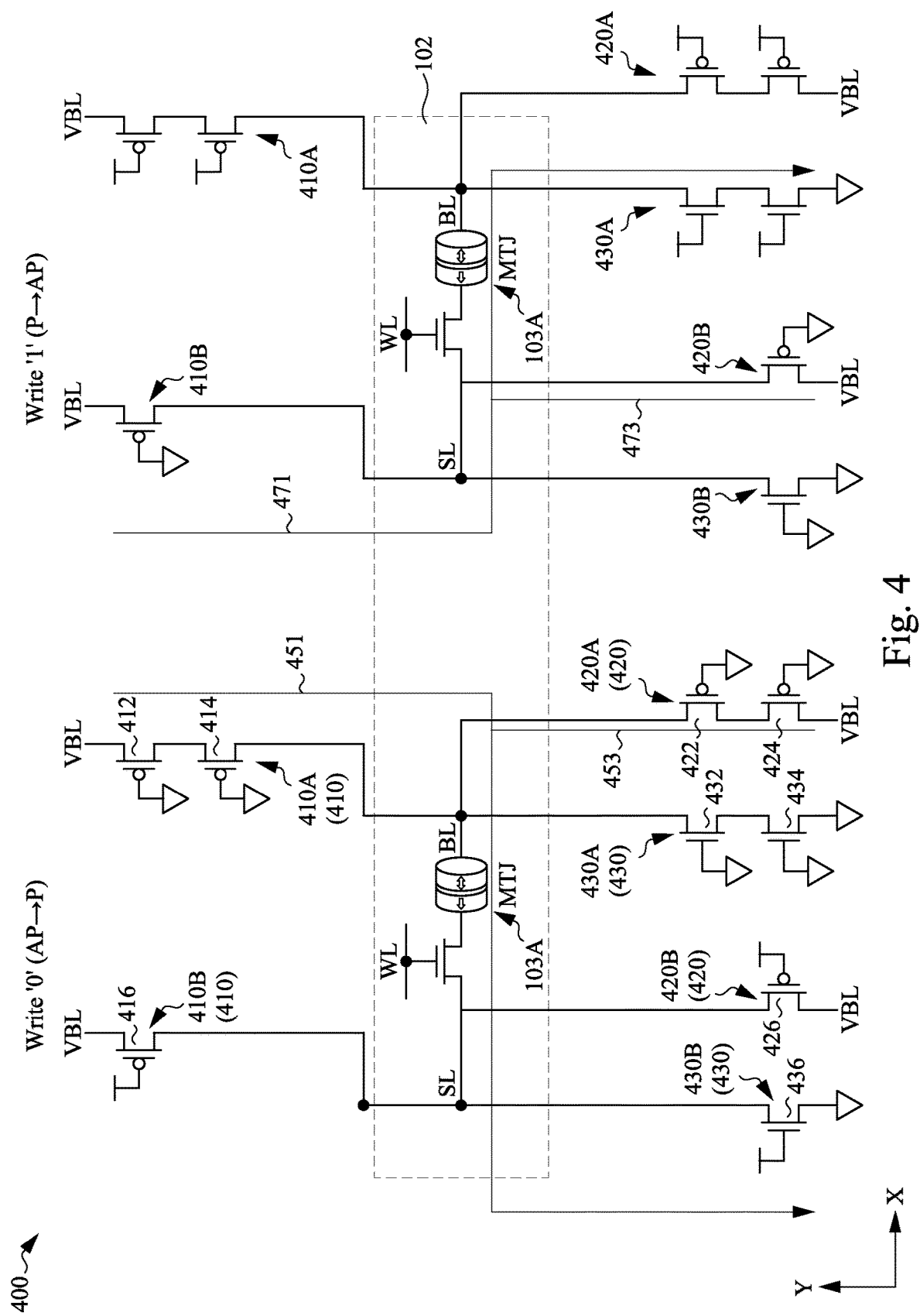
FIG. 4 illustrates another example schematic diagram of a portion of the memory device of FIG. 1 which includes plural access circuits physically disposed on the opposite sides of a memory array, in accordance with some embodiments.

FIG. 4 illustrates another example schematic diagram 400 of a portion of the memory device 100 shown in FIG. 1 (hereinafter "memory device 400"), in accordance with some embodiments of the present disclosure. As a brief overview, the memory device 400 includes a first driver circuit disposed on a first side of the memory array 102, and a second driver circuit and one pull-down circuit disposed on a second, opposite side of the memory array 102. One memory cell (e.g., 103A), implemented as the MRAM cell 200 (FIG. 2), is shown in the memory array 102. In some embodiments, the driver circuit and the pull-down circuits may be a part of the I/O circuit 108. The memory device 400 of FIG. 4 is simplified for illustrative purposes, and thus, it should be understood that some components of FIG. 1 may be omitted in FIG. 4.

As shown, the memory device 400 includes first driver circuit 410, second driver circuit 420, and pull-down circuit 430. The first driver circuit 410 is physically disposed (or otherwise formed) on a first side of the memory array 102, e.g., along the Y-direction, and the second driver circuit 420 and the pull-down circuit 430 are physically disposed on a second side of the memory array 102, e.g., along the Y-direction, in accordance with some embodiments. Further, the first driver circuit 410 includes sub-circuits 410A and 410B; the second driver circuit 420 includes sub-circuits 420A and 420B; and the pull-down circuit 430 includes sub-circuits 430A and 430B.

In some embodiments, the sub-circuit 410A of the first driver circuit 410 includes two p-type transistors 412 and 414 connected to each other in series; the sub-circuit 410B of the first driver circuit 410 includes one p-type transistor 416; the sub-circuit 420A of the second driver circuit 420 includes two p-type transistors 422 and 424 connected to each other in series; the sub-circuit 420B of the second driver circuit 420 includes one p-type transistor 426; the sub-circuit 430A of the pull-down circuit 430 includes two n-type transistors 432 and 434 connected to each other in series; and the sub-circuit 430B of the pull-down circuit 430 includes one n-type transistor 436. The sub-circuits 410A and 410B of the first driver circuit 410 and the sub-circuits 420A and 420B of the second driver circuit 420 are each configured to selectively couple a programming voltage (e.g., $V_{BL}$) to the memory cell 103A through the BL or SL, while the sub-circuits 430A and 430B of the pull-down circuit 430 are each configured to selectively couple the memory cell 103A to ground through the BL or SL.

The p-type transistors 412 to 416 of the first driver circuit 410 are gated (e.g., activated) by respective control signals to couple the programming voltage to the memory cell 103A. Similarly, the p-type transistors 422 to 426 of the second driver circuit 420 are gated (e.g., activated) by respective control signals to couple the programming voltage to the memory cell 103A. For example, the p-type transistors 412 to 416 and 422 to 426 may each turned on in response to the corresponding control signal being asserted to a logic low state. The n-type transistors 432 to 436 of the pull-down circuit 430 are gated (e.g., activated) by respective control signals to couple the memory cell 103A to ground. For example, the n-type transistors 432 to 436 may be each turned on in response to the corresponding control signal being asserted to a logic high state. In some embodiments, respective logic states of these control signals may be configured based on a logic state to be programmed into the memory cell 103A.

In some embodiments, the sub-circuit 410A and the sub-circuit 410B of the first driver circuit 410 can be alternately activated to couple the programming voltage to the memory cell 103A; the sub-circuit 420A and the sub-circuit 420B of the second driver circuit 420 can be alternately activated to couple the programming voltage to the memory cell 103A; and the sub-circuit 430A and the sub-circuit 430B of the pull-down circuit 430 can be alternately activated to couple the memory cell 103A to ground.

For example, to program a logic 0 to the memory cell 103A (from the AP state to the P state), the sub-circuits 410A, 420A, and 430B are activated, while the sub-circuits 410B, 420B, and 430A are deactivated. As such, the programming voltage can be coupled to the memory cell 103A through the BL (and the sub-circuits 410A and 420A, respectively), and the memory cell 103A can be coupled to ground through the SL (and the sub-circuit 430B). Equivalently, two conduction paths 451 and 453 can flow through the memory cell 103A. The conduction path 451 extends from the sub-circuit 410A, through the memory cell 103A and the sub-circuit 430B, and to ground; and the conduction path 453 extends from the sub-circuit 420A, through the memory cell 103A and the sub-circuit 430B, and to ground. Stated another way, the conduction path 451 extends from the first side of the memory array 102 to the second side of the memory array 102, while the conduction path 453 extends from the second side of the memory array 102 to the second side of the memory array 102.

In another example, to program a logic 1 to the memory cell 103A (from the P state to the AP state), the sub-circuits 410B, 420B, and 430A are activated, while the sub-circuits 410A, 420A, and 430B are deactivated. As such, the programming voltage can be coupled to the memory cell 103A through the SL (and the sub-circuits 410B and 420B, respectively), and the memory cell 103A can be coupled to ground through the BL (and the sub-circuits 430A). Equivalently, two conduction paths 471 and 473 can flow through the memory cell 103A. The conduction path 471 extends from the sub-circuit 410B, through the memory cell 103A and the sub-circuit 430A, and to ground; and the conduction path 473 extends from the sub-circuit 420B, through the memory cell 103A and the sub-circuit 430A, and to ground. Stated another way, the conduction path 471 extends from the first side of the memory array 102 to the second side of the memory array 102, while the conduction path 473 extends from the second side of the memory array 102 to the second side of the memory array 102.

Figure 5:
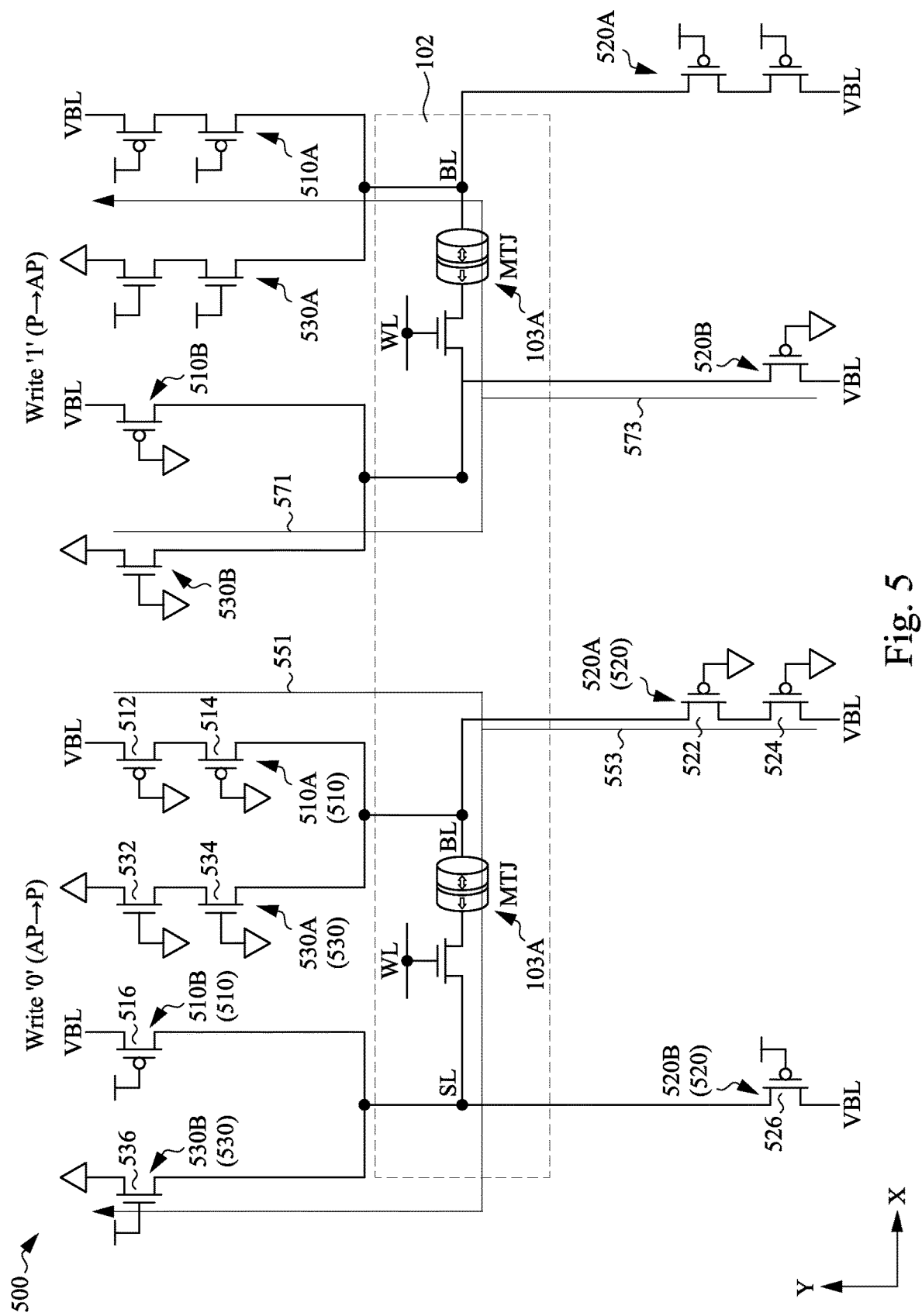
FIG. 5 illustrates yet another example schematic diagram of a portion of the memory device of FIG. 1 which includes plural access circuits physically disposed on the opposite sides of a memory array, in accordance with some embodiments.

FIG. 5 illustrates yet another example schematic diagram 500 of a portion of the memory device 100 shown in FIG. 1 (hereinafter "memory device 500"), in accordance with some embodiments of the present disclosure. As a brief overview, the memory device 500 includes a first driver circuit and one pull-down circuit disposed on a first side of the memory array 102, and a second driver circuit disposed on a second, opposite side of the memory array 102. One memory cell (e.g., 103A), implemented as the MRAM cell 200 (FIG. 2), is shown in the memory array 102. In some embodiments, the driver circuit and the pull-down circuits may be a part of the I/O circuit 108. The memory device 500 of FIG. 5 is simplified for illustrative purposes, and thus, it should be understood that some components of FIG. 1 may be omitted in FIG. 5.

As shown, the memory device 500 includes first driver circuit 510, second driver circuit 520, and pull-down circuit 530. The first driver circuit 510 and the pull-down circuit 530 are physically disposed (or otherwise formed) on a first side of the memory array 102, e.g., along the Y-direction, and the second driver circuit 520 is physically disposed on a second side of the memory array 102, e.g., along the Y-direction, in accordance with some embodiments. Further, the first driver circuit 510 includes sub-circuits 510A and 510B; the second driver circuit 520 includes sub-circuits 520A and 520B; and the pull-down circuit 530 includes sub-circuits 530A and 530B.

In some embodiments, the sub-circuit 510A of the first driver circuit 510 includes two p-type transistors 512 and 514 connected to each other in series; the sub-circuit 510B of the first driver circuit 510 includes one p-type transistor 516; the sub-circuit 520A of the second driver circuit 520 includes two p-type transistors 522 and 524 connected to each other in series; the sub-circuit 520B of the second driver circuit 520 includes one p-type transistor 526; the sub-circuit 530A of the pull-down circuit 530 includes two n-type transistors 532 and 534 connected to each other in series; and the sub-circuit 530B of the pull-down circuit 530 includes one n-type transistor 536. The sub-circuits 510A and 510B of the first driver circuit 510 and the sub-circuits 520A and 520B of the second driver circuit 520 are each configured to selectively couple a programming voltage (e.g., $V_{BL}$) to the memory cell 103A through the BL or SL, while the sub-circuits 530A and 530B of the pull-down circuit 530 are each configured to selectively couple the memory cell 103A to ground through the BL or SL.

The p-type transistors 512 to 516 of the first driver circuit 510 are gated (e.g., activated) by respective control signals to couple the programming voltage to the memory cell 103A. Similarly, the p-type transistors 522 to 526 of the second driver circuit 520 are gated (e.g., activated) by respective control signals to couple the programming voltage to the memory cell 103A. For example, the p-type transistors 512 to 516 and 522 to 526 may each turned on in response to the corresponding control signal being asserted to a logic low state. The n-type transistors 532 to 536 of the pull-down circuit 530 are gated (e.g., activated) by respective control signals to couple the memory cell 103A to ground. For example, the n-type transistors 532 to 536 may be each turned on in response to the corresponding control signal being asserted to a logic high state. In some embodiments, respective logic states of these control signals may be configured based on a logic state to be programmed into the memory cell 103A.

In some embodiments, the sub-circuit 510A and the sub-circuit 510B of the first driver circuit 510 can be alternately activated to couple the programming voltage to the memory cell 103A; the sub-circuit 520A and the sub-circuit 520B of the second driver circuit 520 can be alternately activated to couple the programming voltage to the memory cell 103A; and the sub-circuit 530A and the sub-circuit 530B of the pull-down circuit 530 can be alternately activated to couple the memory cell 103A to ground.

For example, to program a logic 0 to the memory cell 103A (from the AP state to the P state), the sub-circuits 510A, 520A, and 530B are activated, while the sub-circuits 510B, 520B, and 530A are deactivated. As such, the programming voltage can be coupled to the memory cell 103A through the BL (and the sub-circuits 510A and 520A, respectively), and the memory cell 103A can be coupled to ground through the SL (and the sub-circuit 530B). Equivalently, two conduction paths 551 and 553 can flow through the memory cell 103A. The conduction path 551 extends from the sub-circuit 510A, through the memory cell 103A and the sub-circuit 530B, and to ground; and the conduction path 553 extends from the sub-circuit 520A, through the memory cell 103A and the sub-circuit 530B, and to ground. Stated another way, the conduction path 551 extends from the first side of the memory array 102 to the first side of the memory array 102, while the conduction path 553 extends from the second side of the memory array 102 to the first side of the memory array 102.

In another example, to program a logic 1 to the memory cell 103A (from the P state to the AP state), the sub-circuits 510B, 520B, and 530A are activated, while the sub-circuits 510A, 520A, and 530B are deactivated. As such, the programming voltage can be coupled to the memory cell 103A through the SL (and the sub-circuits 510B and 520B, respectively), and the memory cell 103A can be coupled to ground through the BL (and the sub-circuits 530A). Equivalently, two conduction paths 571 and 573 can flow through the memory cell 103A. The conduction path 571 extends from the sub-circuit 510B, through the memory cell 103A and the sub-circuit 530A, and to ground; and the conduction path 573 extends from the sub-circuit 520B, through the memory cell 103A and the sub-circuit 530A, and to ground. Stated another way, the conduction path 571 extends from the first side of the memory array 102 to the first side of the memory array 102, while the conduction path 573 extends from the second side of the memory array 102 to the first side of the memory array 102.

Figure 6:
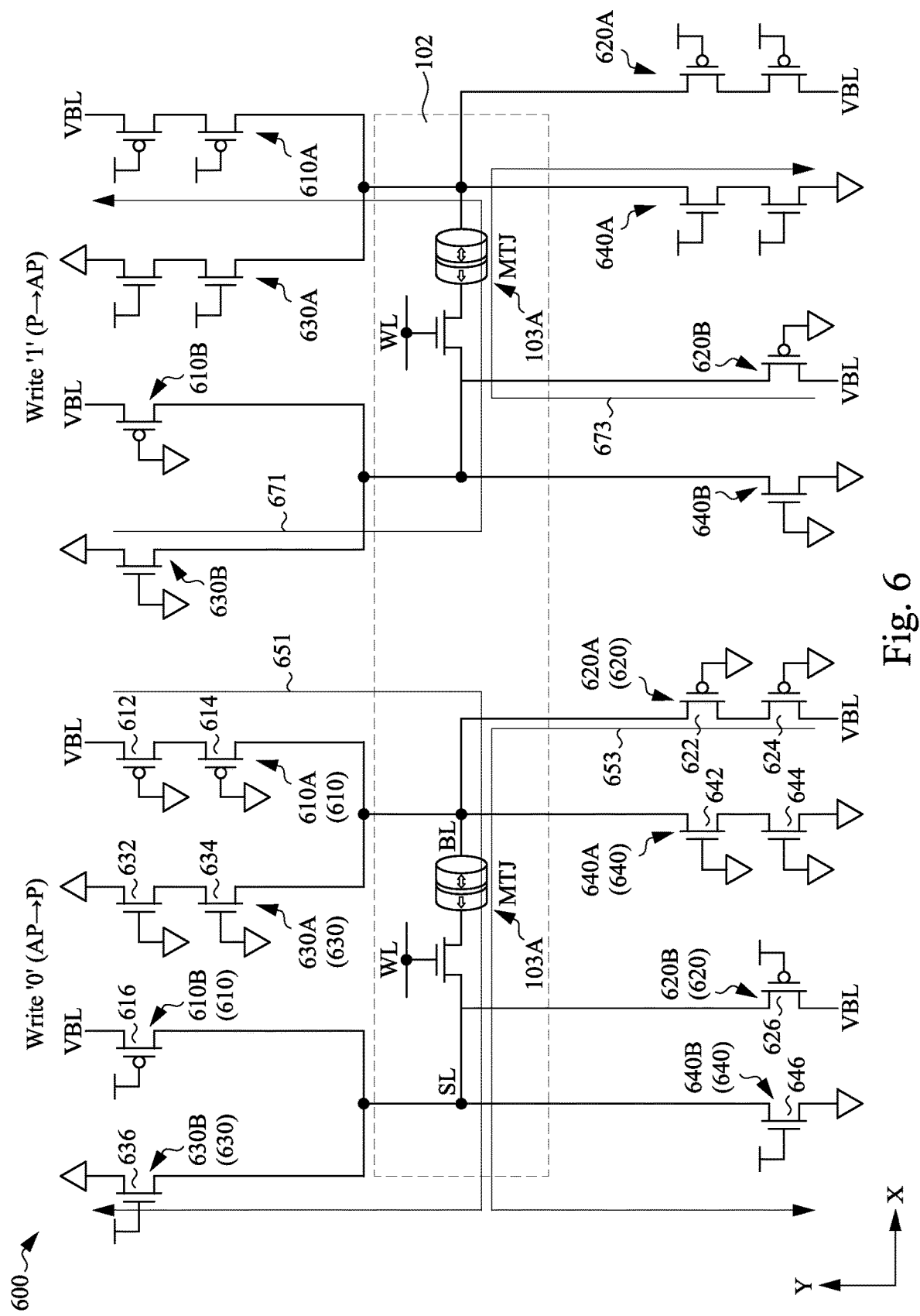
FIG. 6 illustrates yet another example schematic diagram of a portion of the memory device of FIG. 1 which includes plural access circuits physically disposed on the opposite sides of a memory array, in accordance with some embodiments.

FIG. 6 illustrates yet another example schematic diagram 600 of a portion of the memory device 100 shown in FIG. 1 (hereinafter "memory device 600"), in accordance with some embodiments of the present disclosure. As a brief overview, the memory device 600 includes a first driver circuit and a first pull-down circuit disposed on a first side of the memory array 102, and a second driver circuit and a second pull-down circuit disposed on a second, opposite side of the memory array 102. One memory cell (e.g., 103A), implemented as the MRAM cell 200 (FIG. 2), is shown in the memory array 102. In some embodiments, the driver circuit and the pull-down circuits may be a part of the I/O circuit 108. The memory device 600 of FIG. 6 is simplified for illustrative purposes, and thus, it should be understood that some components of FIG. 1 may be omitted in FIG. 6.

As shown, the memory device 600 includes first driver circuit 610, second driver circuit 620, first pull-down circuit 630, and second pull-down circuit 640. The first driver circuit 610 and the first pull-down circuit 630 are physically disposed (or otherwise formed) on a first side of the memory array 102, e.g., along the Y-direction, and the second driver circuit 620 and the second pull-down circuit 640 are physically disposed on a second side of the memory array 102, e.g., along the Y-direction, in accordance with some embodiments. Further, the first driver circuit 610 includes sub-circuits 610A and 610B; the second driver circuit 620 includes sub-circuits 620A and 620B; the first pull-down circuit 630 includes sub-circuits 630A and 630B; and the second pull-down circuit 640 includes sub-circuits 640A and 640B.

In some embodiments, the sub-circuit 610A of the first driver circuit 610 includes two p-type transistors 612 and 614 connected to each other in series; the sub-circuit 610B of the first driver circuit 610 includes one p-type transistor 616; the sub-circuit 620A of the second driver circuit 620 includes two p-type transistors 622 and 624 connected to each other in series; the sub-circuit 620B of the second driver circuit 620 includes one p-type transistor 626; the sub-circuit 630A of the first pull-down circuit 630 includes two n-type transistors 632 and 634 connected to each other in series; the sub-circuit 630B of the pull-down circuit 630 includes one n-type transistor 636; the sub-circuit 640A of the second pull-down circuit 640 includes two n-type transistors 642 and 644 connected to each other in series; and the sub-circuit 640B of the second pull-down circuit 640 includes one n-type transistor 646. The sub-circuits 610A and 610B of the first driver circuit 610 and the sub-circuits 620A and 620B of the second driver circuit 620 are each configured to selectively couple a programming voltage (e.g., $V_{BL}$) to the memory cell 103A through the BL or SL, while the sub-circuits 630A and 630B of the pull-down circuit 630 and the sub-circuits 640A and 640B of the pull-down circuit 640 are each configured to selectively couple the memory cell 103A to ground through the BL or SL.

The p-type transistors 612 to 616 of the first driver circuit 610 are gated (e.g., activated) by respective control signals to couple the programming voltage to the memory cell 103A. Similarly, the p-type transistors 622 to 626 of the second driver circuit 620 are gated (e.g., activated) by respective control signals to couple the programming voltage to the memory cell 103A. For example, the p-type transistors 612 to 616 and 622 to 626 may each turned on in response to the corresponding control signal being asserted to a logic low state. The n-type transistors 632 to 636 of the first pull-down circuit 630 are gated (e.g., activated) by respective control signals to couple the memory cell 103A to ground. Similarly, the n-type transistors 642 to 646 of the second pull-down circuit 640 are gated (e.g., activated) by respective control signals to couple the memory cell 103A to ground. For example, the n-type transistors 632 to 636 and 642 to 646 may be each turned on in response to the corresponding control signal being asserted to a logic high state. In some embodiments, respective logic states of these control signals may be configured based on a logic state to be programmed into the memory cell 103A.

In some embodiments, the sub-circuit 610A and the sub-circuit 610B of the first driver circuit 610 can be alternately activated to couple the programming voltage to the memory cell 103A; the sub-circuit 620A and the sub-circuit 620B of the second driver circuit 620 can be alternately activated to couple the programming voltage to the memory cell 103A; the sub-circuit 630A and the sub-circuit 630B of the first pull-down circuit 630 can be alternately activated to couple the memory cell 103A to ground; and the sub-circuit 640A and the sub-circuit 640B of the second pull-down circuit 640 can be alternately activated to couple the memory cell 103A to ground.

For example, to program a logic 0 to the memory cell 103A (from the AP state to the P state), the sub-circuits 610A, 620A, 630B, and 640B are activated, while the sub-circuits 610B, 620B, 630A, and 640A are deactivated. As such, the programming voltage can be coupled to the memory cell 103A through the BL (and the sub-circuits 610A and 620A, respectively), and the memory cell 103A can be coupled to ground through the SL (and the sub-circuit 630B and 640B, respectively). Equivalently, two conduction paths 651 and 653 can flow through the memory cell 103A. The conduction path 651 extends from the sub-circuit 610A, through the memory cell 103A and the sub-circuit 630B, and to ground; and the conduction path 653 extends from the sub-circuit 620A, through the memory cell 103A and the sub-circuit 640B, and to ground. Stated another way, the conduction path 651 extends from the first side of the memory array 102 to the first side of the memory array 102, while the conduction path 653 extends from the second side of the memory array 102 to the second side of the memory array 102.

In another example, to program a logic 1 to the memory cell 103A (from the P state to the AP state), the sub-circuits 610B, 620B, 630A, and 640A are activated, while the sub-circuits 610A, 620A, 630B, and 640B are deactivated. As such, the programming voltage can be coupled to the memory cell 103A through the SL (and the sub-circuits 610B and 620B, respectively), and the memory cell 103A can be coupled to ground through the BL (and the sub-circuits 630A and 640A, respectively). Equivalently, two conduction paths 671 and 673 can flow through the memory cell 103A. The conduction path 671 extends from the sub-circuit 610B, through the memory cell 103A and the sub-circuit 630A, and to ground; and the conduction path 673 extends from the sub-circuit 620B, through the memory cell 103A and the sub-circuit 640A, and to ground. Stated another way, the conduction path 671 extends from the first side of the memory array 102 to the first side of the memory array 102, while the conduction path 673 extends from the second side of the memory array 102 to the second side of the memory array 102.

Figure 7:
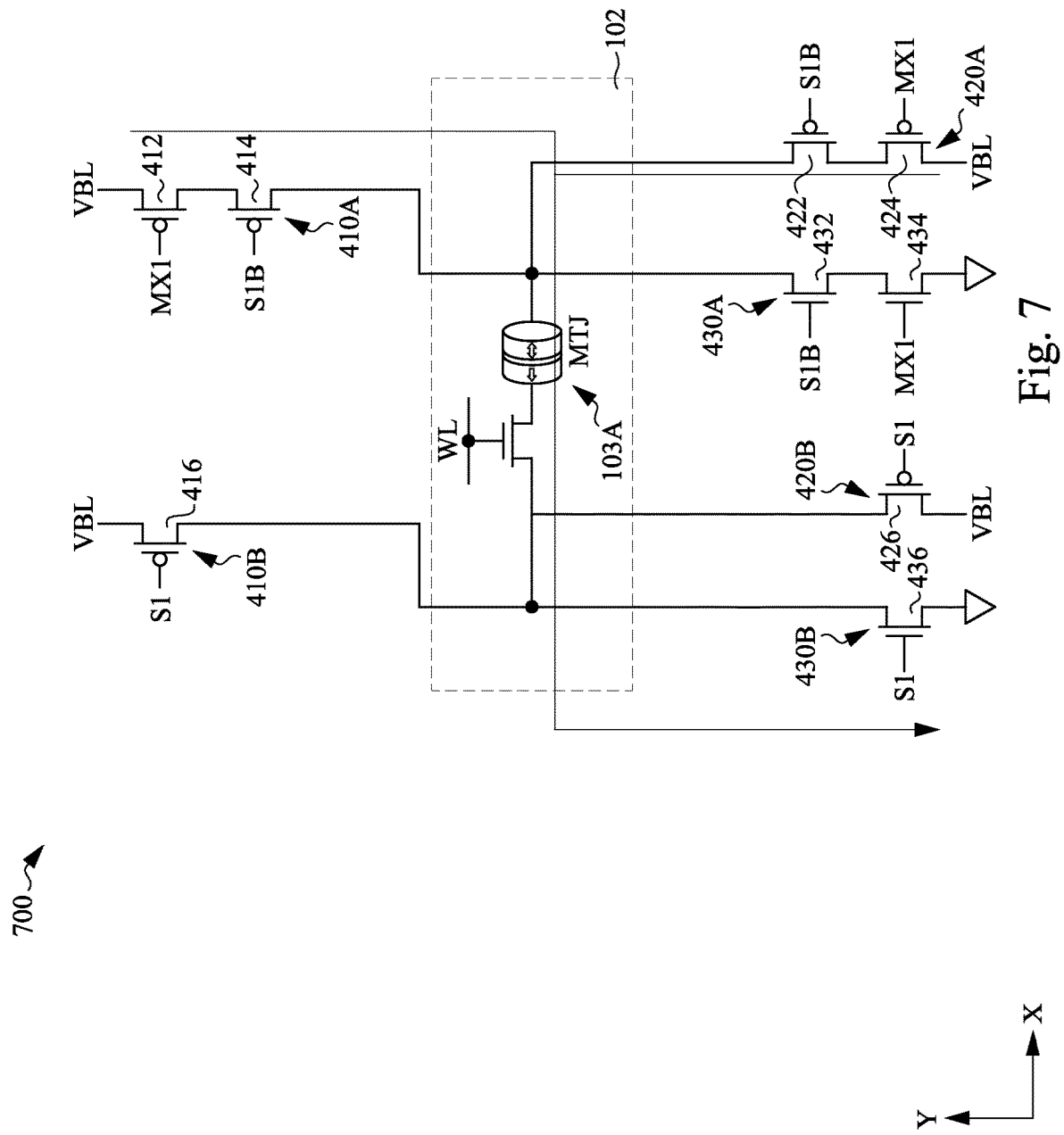
FIG. 7 illustrates yet another example schematic diagram of a portion of the memory device of FIG. 1 which includes plural access circuits physically disposed on the opposite sides of a memory array, in accordance with some embodiments.

FIG. 7 illustrates yet another example schematic diagram 700 of a portion of the memory device 100 shown in FIG. 1 (hereinafter "memory device 700"), in accordance with some embodiments of the present disclosure. The memory device 700 is substantially similar to the memory device 400 (FIG. 4), e.g., including first driver circuit 410 disposed on the first side of the memory array 102, and second driver circuit 420 and pull-down circuit 430 disposed on the second side of the memory array 102, except that the transistors of each of the sub-circuits 410A, 420A, and 430A may be activated by different control signals. Accordingly, the following discussion of the memory device 700 will be focused on the difference.

For the sub-circuit 410A, the transistor 412 is gated by a control signal MX1 while the transistor 414 is gated by a control signal S1B; and for the sub-circuit 410B, the transistor 416 is gated by a control signal S1. Similarly, the transistor 422 and 424 of the sub-circuit 420A are gated by the control signals S1B and MX1, respectively, while the transistor 426 of the sub-circuit 420B is gated by the control signal S1; and the transistor 432 and 434 of the sub-circuit 430A are gated by the control signals S1B and MX1, respectively, while the transistor 436 of the sub-circuit 430B is gated by the control signal S1. In some embodiments, a logic state of the signal MX1 may be configured based on determining that a group of columns of the memory cells are to be programmed/read, and a logic state of the signal S1/S1B may be configured based on determining that a certain memory cell is to be programmed/read. As such, the signal MX1 and the signal S1/S1B may have respectively different pulse widths. For example, a pulse width of the signal MX1 wider than a pulse width of the signal S1/S1B. Further, the control signals S1 and S1B are logically inverse to each other. As such, the sub-circuits of any of the first driver circuit 410, second driver circuit 420, and pull-down circuit 430 can be alternately activated.

Using FIG. 7 as a representative example, the signal MX1 may be pulled to a logic low state, followed by the signal S1B pulled to a logic state (with the signal S1 pulled to a logic high state). In some other embodiments, the signal MX1 and the signal S1B can be pulled down concurrently. Consequently, the sub-circuits 410A, 420A, and 430B can be activated, while the sub-circuits 410B, 420B, and 430A can be deactivated. As such, the sub-circuits 410A and 420A can each couple the programming voltage ($V_{BL}$) to the memory cell 103A, and the sub-circuit 430B can couple the memory cell 103A to ground, thereby writing a logic 0 to the memory cell 103A.

Figure 8:
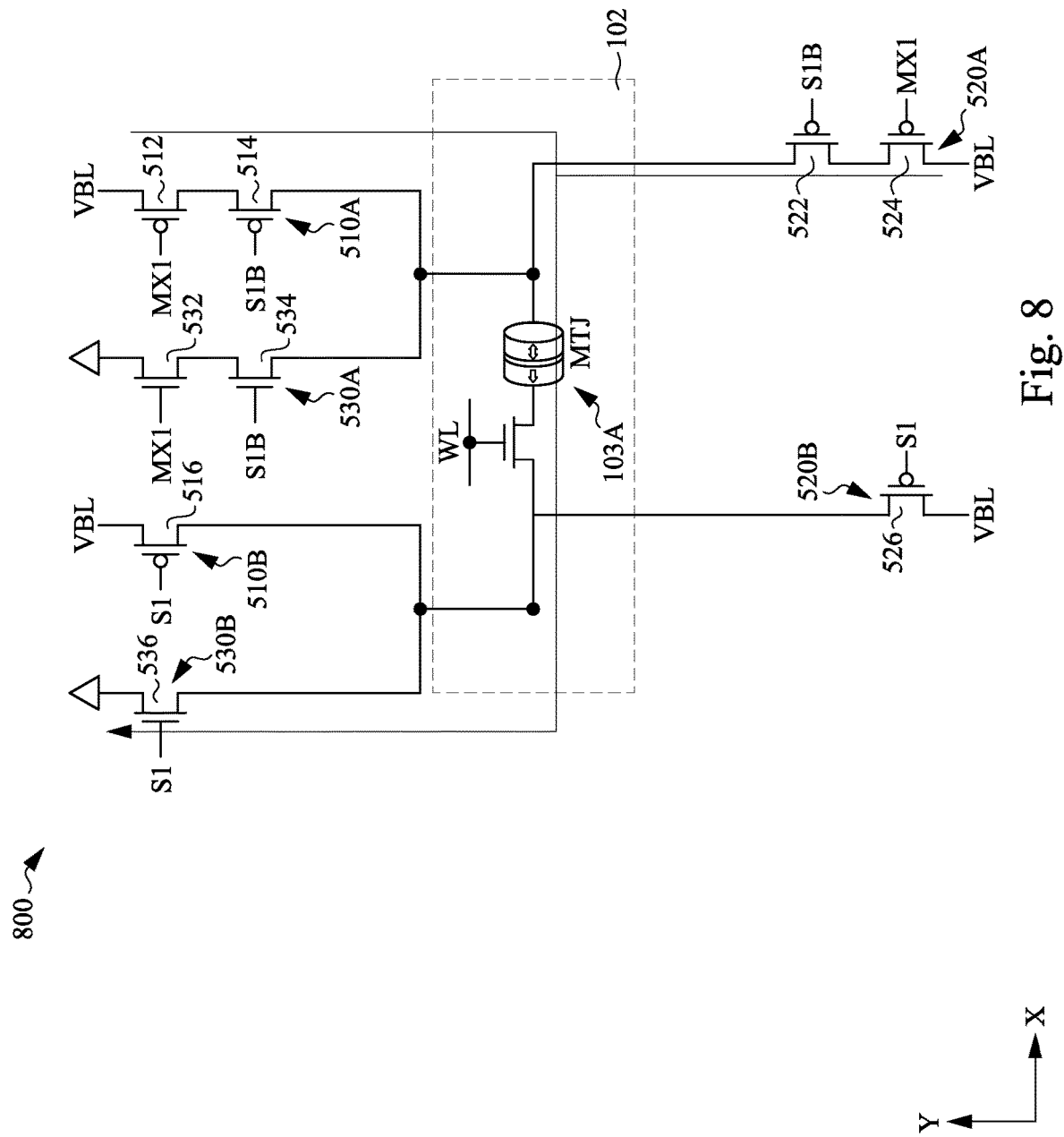
FIG. 8 illustrates yet another example schematic diagram of a portion of the memory device of FIG. 1 which includes plural access circuits physically disposed on the opposite sides of a memory array, in accordance with some embodiments.

FIG. 8 illustrates yet another example schematic diagram 800 of a portion of the memory device 100 shown in FIG. 1 (hereinafter "memory device 800"), in accordance with some embodiments of the present disclosure. The memory device 800 is substantially similar to the memory device 500 (FIG. 5), e.g., including first driver circuit 510 and pull-down circuit 530 disposed on the first side of the memory array 102, and second driver circuit 520 disposed on the second side of the memory array 102, except that the transistors of each of the sub-circuits 510A, 520A, and 530A may be activated by different control signals. Accordingly, the following discussion of the memory device 800 will be focused on the difference.

For the sub-circuit 510A, the transistor 512 is gated by a control signal MX1 while the transistor 514 is gated by a control signal S1B; and for the sub-circuit 510B, the transistor 516 is gated by a control signal S1. Similarly, the transistor 522 and 524 of the sub-circuit 520A are gated by the control signals S1B and MX1, respectively, while the transistor 526 of the sub-circuit 520B is gated by the control signal S1; and the transistor 532 and 534 of the sub-circuit 530A are gated by the control signals MX1 and S1B, respectively, while the transistor 536 of the sub-circuit 530B is gated by the control signal S1. In some embodiments, a logic state of the signal MX1 may be configured based on determining that a group of columns of the memory cells are to be programmed/read, and a logic state of the signal S1/S1B may be configured based on determining that a certain memory cell is to be programmed/read. As such, the signal MX1 and the signal S1/S1B may have respectively different pulse widths. For example, a pulse width of the signal MX1 wider than a pulse width of the signal S1/S1B. Further, the control signals S1 and S1B are logically inverse to each other. As such, the sub-circuits of any of the first driver circuit 510, second driver circuit 520, and pull-down circuit 530 can be alternately activated.

Using FIG. 8 as a representative example, the signal MX1 may be pulled to a logic low state, followed by the signal S1B pulled to a logic state (with the signal S1 pulled to a logic high state). In some other embodiments, the signal MX1 and the signal S1B can be pulled down concurrently. Consequently, the sub-circuits 510A, 520A, and 530B can be activated, while the sub-circuits 510B, 520B, and 530A can be deactivated. As such, the sub-circuits 510A and 520A can each couple the programming voltage ($V_{BL}$) to the memory cell 103A, and the sub-circuit 530B can couple the memory cell 103A to ground, thereby writing a logic 0 to the memory cell 103A.

Figure 9:
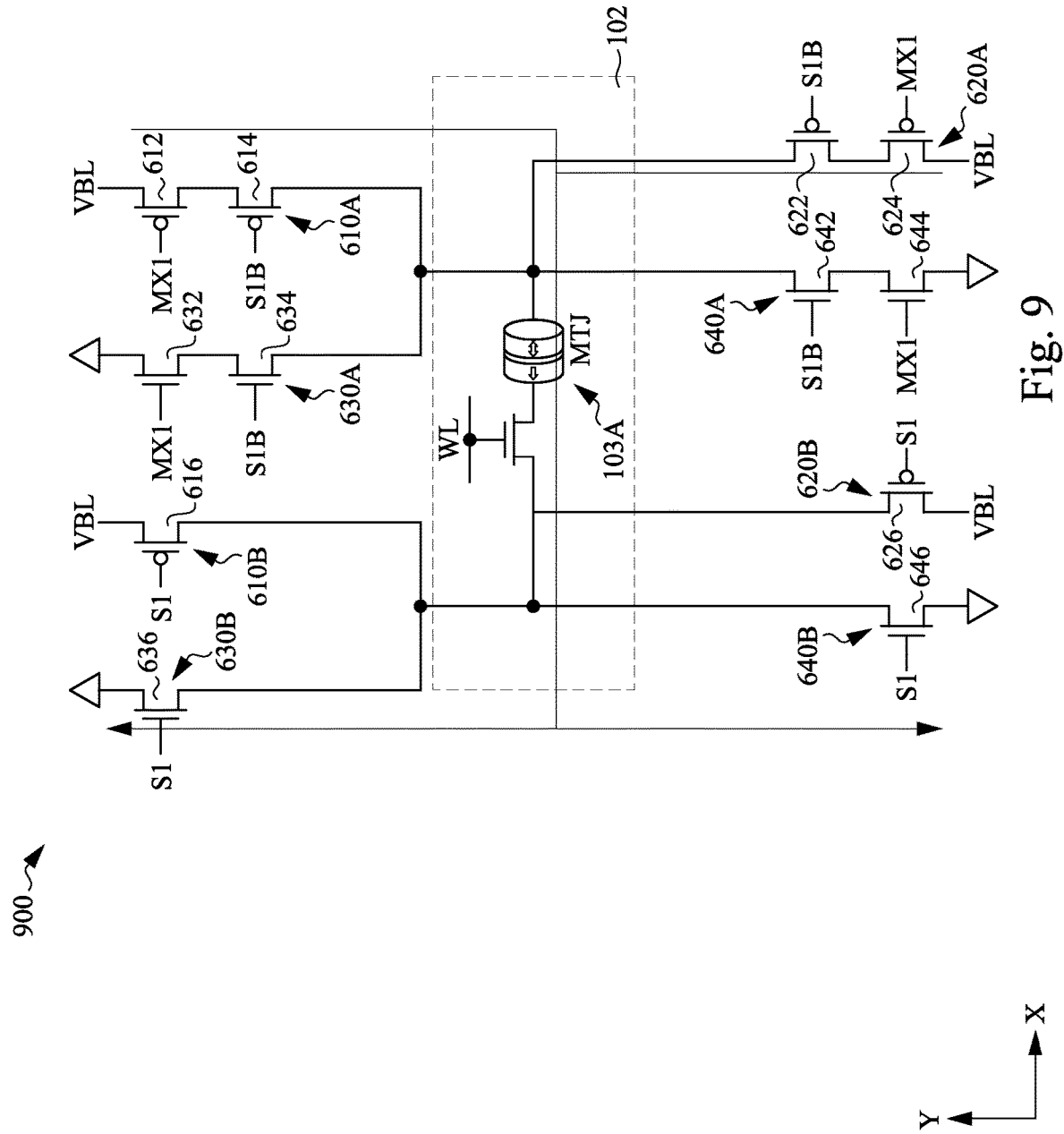
FIG. 9 illustrates yet another example schematic diagram of a portion of the memory device of FIG. 1 which includes plural access circuits physically disposed on the opposite sides of a memory array, in accordance with some embodiments.

FIG. 9 illustrates yet another example schematic diagram 900 of a portion of the memory device 100 shown in FIG. 1 (hereinafter "memory device 900"), in accordance with some embodiments of the present disclosure. The memory device 900 is substantially similar to the memory device 600 (FIG. 6), e.g., including first driver circuit 610 and first pull-down circuit 630 disposed on the first side of the memory array 102, and second driver circuit 620 and second pull-down circuit 640 disposed on the second side of the memory array 102, except that the transistors of each of the sub-circuits 610A, 620A, 630A, and 640A may be activated by different control signals. Accordingly, the following discussion of the memory device 900 will be focused on the difference.

For the sub-circuit 610A, the transistor 612 is gated by a control signal MX1 while the transistor 614 is gated by a control signal S1B; and for the sub-circuit 610B, the transistor 616 is gated by a control signal S1. Similarly, the transistor 622 and 624 of the sub-circuit 620A are gated by the control signals S1B and MX1, respectively, while the transistor 626 of the sub-circuit 620B is gated by the control signal S1; the transistor 632 and 634 of the sub-circuit 630A are gated by the control signals MX1 and S1B, respectively, while the transistor 636 of the sub-circuit 630B is gated by the control signal S1; and the transistor 642 and 644 of the sub-circuit 640A are gated by the control signals S1B and MX1, respectively, while the transistor 646 of the sub-circuit 640B is gated by the control signal S1. In some embodiments, a logic state of the signal MX1 may be configured based on determining that a group of columns of the memory cells are to be programmed/read, and a logic state of the signal S1/S1B may be configured based on determining that a certain memory cell is to be programmed/read. As such, the signal MX1 and the signal S1/S1B may have respectively different pulse widths. For example, a pulse width of the signal MX1 wider than a pulse width of the signal S1/S1B. Further, the control signals S1 and S1B are logically inverse to each other. As such, the sub-circuits of any of the first driver circuit 610, second driver circuit 620, first pull-down circuit 630, and second pull-down circuit 640 can be alternately activated.

Using FIG. 9 as a representative example, the signal MX1 may be pulled to a logic low state, followed by the signal S1B pulled to a logic state (with the signal S1 pulled to a logic high state). In some other embodiments, the signal MX1 and the signal S1B can be pulled down concurrently. Consequently, the sub-circuits 610A, 620A, 630B, and 640B can be activated, while the sub-circuits 610B, 620B, 630A, and 640A can be deactivated. As such, the sub-circuits 610A and 620A can each couple the programming voltage ($V_{BL}$) to the memory cell 103A, and the sub-circuit 630B and 640B can each couple the memory cell 103A to ground, thereby writing a logic 0 to the memory cell 103A.

Figure 10:
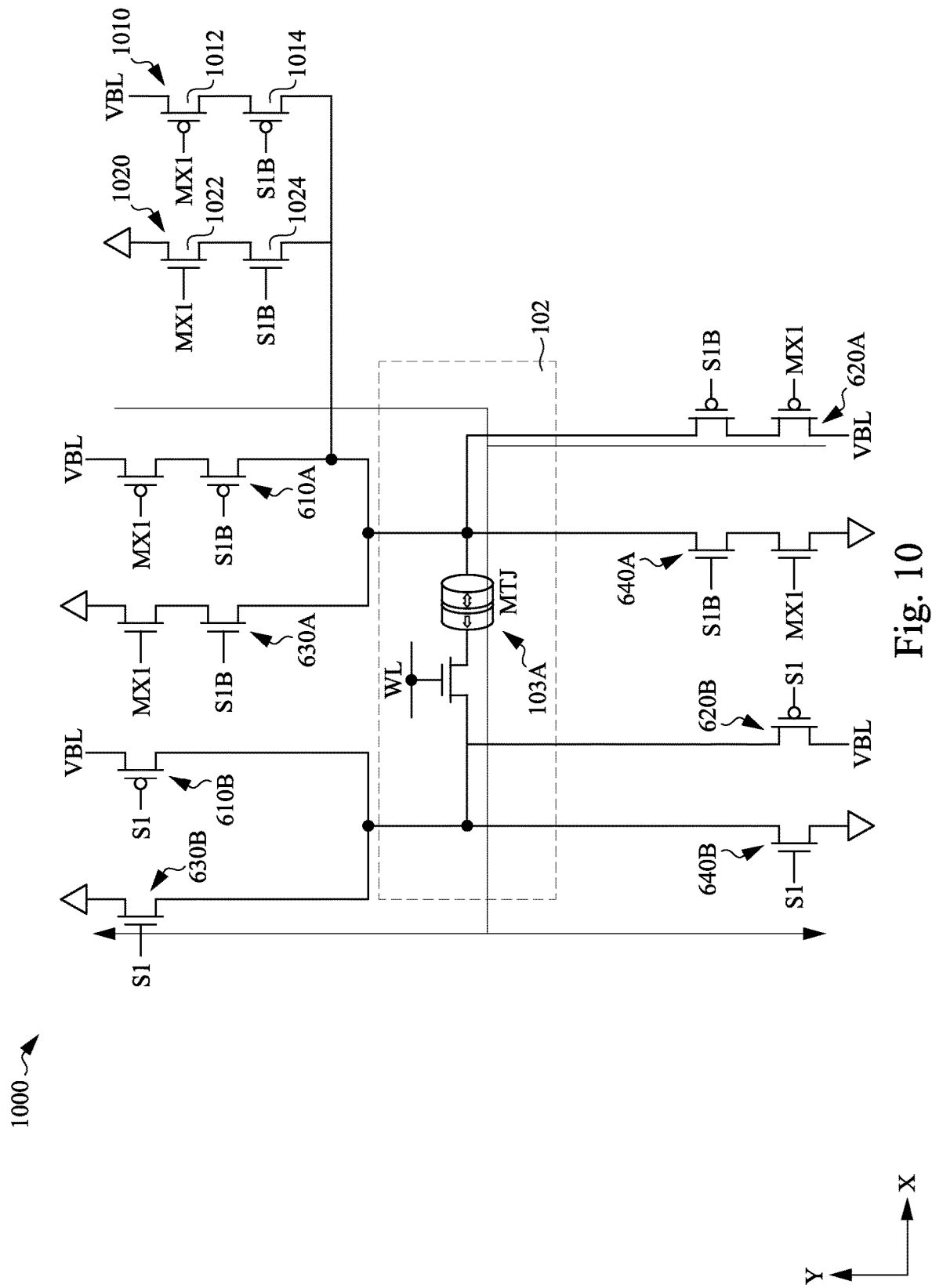
FIG. 10 illustrates yet another example schematic diagram of a portion of the memory device of FIG. 1 which includes plural access circuits physically disposed on the opposite sides of a memory array, in accordance with some embodiments.

FIG. 10 illustrates yet another example schematic diagram 1000 of a portion of the memory device 100 shown in FIG. 1 (hereinafter "memory device 1000"), in accordance with some embodiments of the present disclosure. The memory device 1000 is substantially similar to the memory device 900 (FIG. 9), e.g., including first driver circuit 610 and first pull-down circuit 630 disposed on the first side of the memory array 102 and controlled by the signals MX1/S1B/S1, and second driver circuit 620 and second pull-down circuit 640 disposed on the second side of the memory array 102 and controlled by the signals MX1/S1B/S1, except that the memory device 1000 further includes sub-circuits 1010 and 1020 to further reduce the conduction resistance. Accordingly, the following discussion of the memory device 1000 will be focused on the difference.

As shown, the sub-circuits 1010 and 1020 are physically disposed on the same side of the memory array 102 as the sub-circuits 610A-B and 630A-B (i.e., the first side along the Y-direction). It should be understood that the sub-circuits 1010 and 1020 can be disposed on the second side of the memory array 102 (i.e., the same side as the sub-circuits 620A-B and 640A-B), while remaining within the scope of the present disclosure. Further, the sub-circuit 1010 includes p-type transistors 1012 and 1014 that are gated by the signals MX1 and S1B, respectively; and the sub-circuit 1020 includes n-type transistors 1022 and 1024 that are gated by the signals MX1 and S1B, respectively. In some embodiments, the sub-circuit 1010 is configured to couple the programming voltage ($V_{BL}$) to the memory cell 103A; and the sub-circuit 1020 is configured to couple the memory cell 103A to ground. In some embodiments, the sub-circuit 1010 may be concurrently activated with the sub-circuits 610A, 620A, 630B, and 640B, and thus, at least one additional conduction path can be formed to extend through the memory cell 103A (e.g., from the sub-circuit 1010, through the memory cell 103A and sub-circuit 630B, and to ground).

Figure 11:
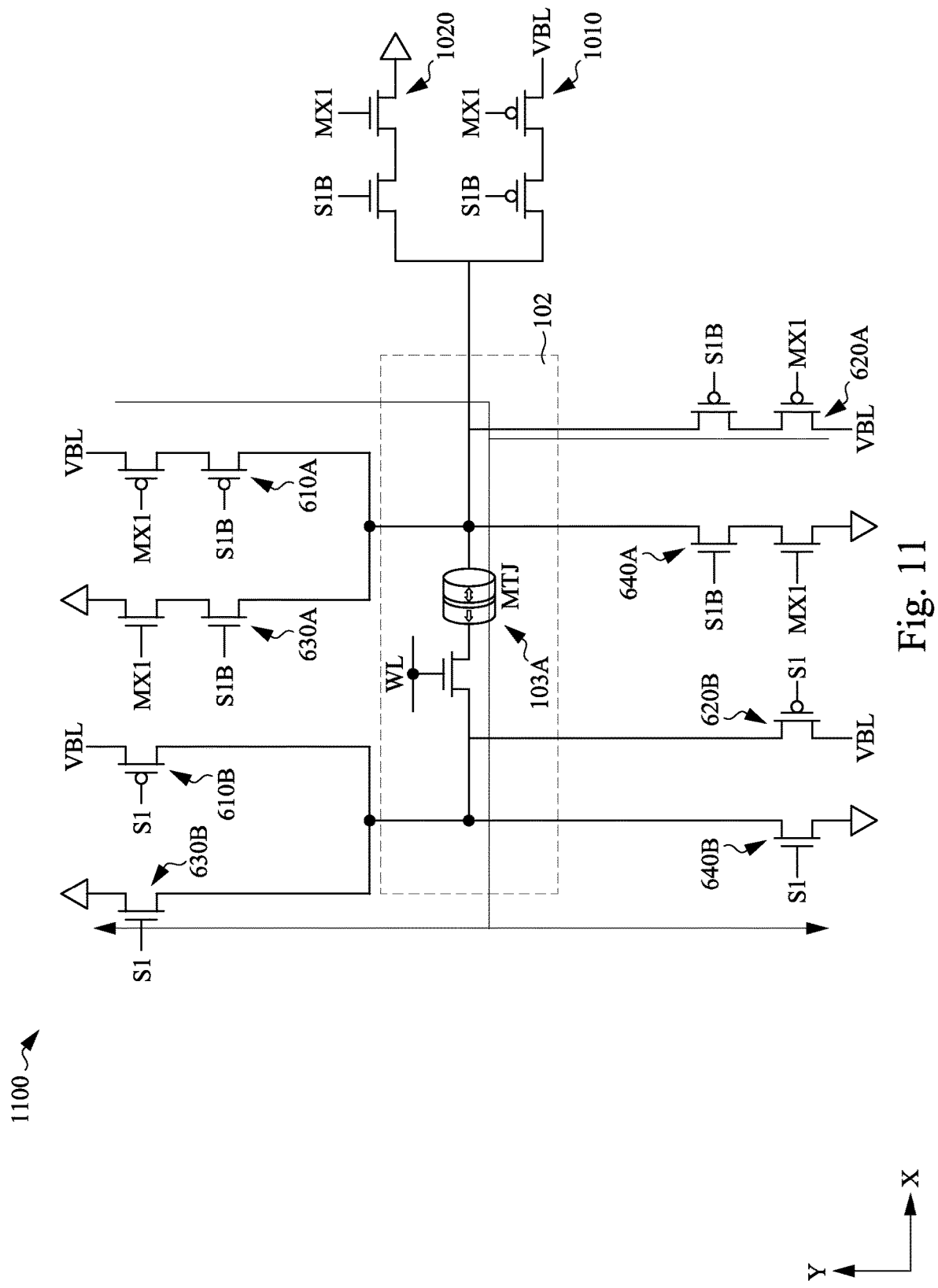
FIG. 11 illustrates yet another example schematic diagram of a portion of the memory device of FIG. 1 which includes plural access circuits physically disposed on the opposite sides of a memory array, in accordance with some embodiments.

FIG. 11 illustrates yet another example schematic diagram 1100 of a portion of the memory device 100 shown in FIG. 1 (hereinafter "memory device 1100"), in accordance with some embodiments of the present disclosure. The memory device 1100 is substantially similar to the memory device 1000 (FIG. 10), e.g., including first driver circuit 610 and first pull-down circuit 630 controlled by the signals MX1/S1B/S1, second driver circuit 620 and second pull-down circuit 640 controlled by the signals MX1/S1B/S1, except that the memory device 1000 further includes sub-circuits 1010 and 1020 to further reduce the conduction resistance. Accordingly, the following discussion of the memory device 1000 will be focused on the difference. As shown, the additional sub-circuits 1010 and 1020 can be physically disposed on a third side of the memory array. For example, sub-circuits 1010 and 1020 may be disposed on one of the sides of the memory array 102 along the X-direction.

Figure 12:
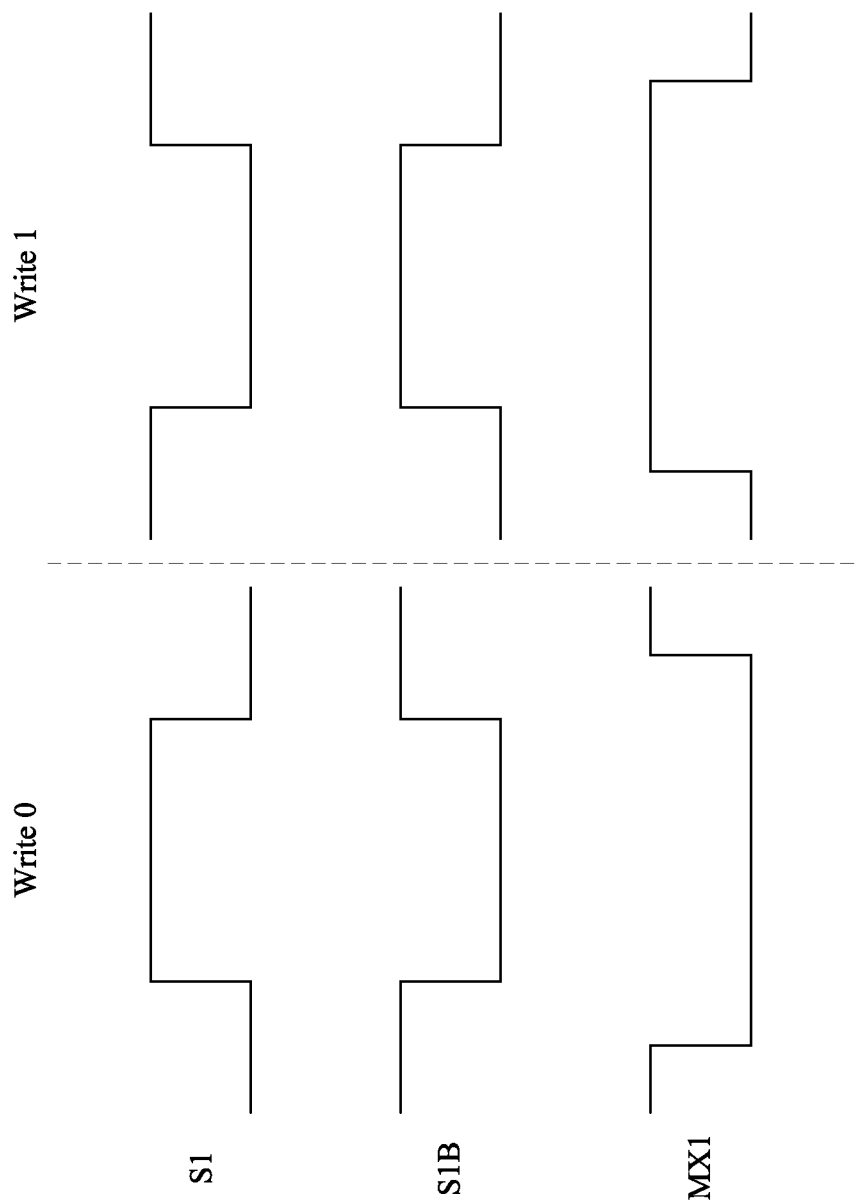
FIG. 12 illustrates example waveforms of multiple control signals to operate the memory device of FIG. 1 which includes plural access circuits physically disposed on the opposite sides of a memory array, in accordance with some embodiments.

FIG. 12 illustrates waveforms of the above-described signals S1, S1B, and MX1, in accordance with some embodiments of the present disclosure. For example, the respective waveforms of the signals S1, S1B, and MX1 when writing a logic 0 and writing a logic 1 to a corresponding memory cell (e.g., 103A) are illustrated, respectively. When writing a logic 0, the signal MX1 may be pulled to low, followed by pulling the signal S1 to high (with the logically inverse signal S1B pulled to low). When writing a logic 1, the signal MX1 may be pulled to high, followed by pulling the signal S1 to low (with the logically inverse signal S1B pulled to high).

Figure 13:
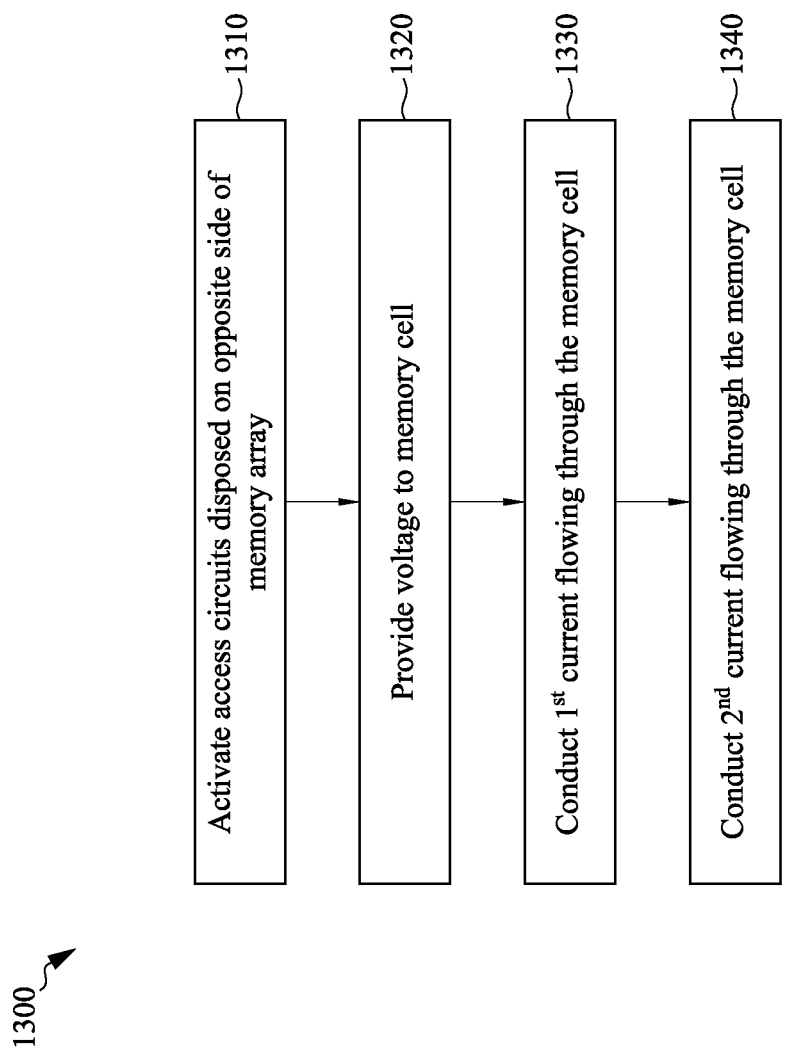
FIG. 13 illustrates an example flow chart of a method for operating a memory device which includes plural access circuits physically disposed on the opposite sides of a memory array, in accordance with some embodiments.

FIG. 13 illustrates a flow chart of an example method 1300 for operating a memory device including access circuits physically disposed on the opposite sides of a memory array, in accordance with some embodiments. For example, at least some of the operations of the method 1300 can be performed to write/read a memory cell (e.g., 103A) based on at least two conduction paths. Thus, in the following discussion of the methods 1300, the reference numerals used in the figures above (e.g., FIGS. 1-12) may be reused. It is noted that the method 1300 is merely an example and is not intended to limit the present disclosure. Accordingly, it is understood that additional operations may be provided before, during, and after the method 1300 of FIG. 13, and that some other operations may only be briefly described herein.

The method 1300 starts with operations 1310 in which a plurality of access circuits that are physically disposed on the opposite sides of a memory array are activated. In some embodiments, the memory array (e.g., 102) includes a plural number of memory cells (e.g., MRAM cells 103) arranged over a number of columns and a number of rows. Along each column, a subset of the memory cells are coupled to one another through a bit line and a source line, each of which may extend along the Y-direction; and along each row, another subset of the memory cells are coupled to one another through a word line, which may extend along the X-direction.

In one aspect of the present disclosure (e.g., the memory device 300 of FIG. 3), a first access circuit (e.g., 310) is physically disposed on a first side of the memory array 102 along the Y-direction, a second access circuit (e.g., 320) is physically disposed on the first side of the memory array 102, and a third access circuit (e.g., 330) is physically disposed on a second side of the memory array 102 along the Y-direction. In another aspect of the present disclosure (e.g., the memory device 400 of FIG. 4), a first access circuit (e.g., 410) is physically disposed on the first side of the memory array 102, a second access circuit (e.g., 420) is physically disposed on the second side of the memory array 102, and a third access circuit (e.g., 430) is physically disposed on the second side of the memory array 102. In yet another aspect of the present disclosure (e.g., the memory device 500 of FIG. 5), a first access circuit (e.g., 510) is physically disposed on the first side of the memory array 102, a second access circuit (e.g., 520) is physically disposed on the second side of the memory array 102, and a third access circuit (e.g., 530) is physically disposed on the first side of the memory array 102. In yet another aspect of the present disclosure (e.g., the memory device 600 of FIG. 6), a first access circuit (e.g., 610) is physically disposed on the first side of the memory array 102, a second access circuit (e.g., 620) is physically disposed on the second side of the memory array 102, a third access circuit (e.g., 630) is physically disposed on the first side of the memory array 102, and a fourth access circuit (e.g., 640) is physically disposed on the second side of the memory array 102.

To access (e.g., program, read) the memory array, the plural access circuits can be activated. Specifically, each access circuit can include two sub-circuits that may be alternately activated based on a logic state to be programmed to a corresponding memory cell. With at least two of the access circuits disposed on the opposite sides of the memory array 102, each memory cell of the memory array 102 can be programmed/read through at least two conduction paths, which can advantageously decrease an equivalent resistance along the conduction paths. In the following discussion of the method 1300, the memory device 300 (FIG. 3) is used as a representative example. When writing a logic 0, the sub-circuit 310A of the access circuit 310, the sub-circuit 320B of the access circuit 320, and the sub-circuit 330B of the access circuit 330 are activated, with the other sub-circuit (310B, 320A, 330A) of each of the access circuits being deactivated. When writing a logic 1, the sub-circuit 310B of the access circuit 310, the sub-circuit 320A of the access circuit 320, and the sub-circuit 330A of the access circuit 330 are activated, with the other sub-circuit (310A, 320B, 330B) of each of the access circuits being deactivated.

The method 1300 proceeds to operation 1320 in which a voltage is provided to the memory cell. Continuing with the same example above, the voltage may be a programming voltage ($V_{BL}$) when the memory cell is selected to be programmed. Based on the logic state to be programmed, different sub-circuits of the access circuits can be activated to couple the programming voltage to the memory cell. When the sub-circuits 310A, 320B, and 330B are activated (e.g., writing a logic 0 to the memory cell), the programming voltage can be coupled to the memory cell through its corresponding bit line. When the sub-circuits 310B, 320A, and 330A are activated (e.g., writing a logic 1 to the memory cell), the programming voltage can be coupled to the memory cell through its corresponding source line.

The method 1300 proceeds to operation 1330 in which a first current is conducted to flow through the memory cell, and operation 1340 in which a second current is conducted to flow through the memory cell. In some embodiments, the operations 1330 and 1340 may be performed at the same time. Still with the same example above (when writing a logic 0 to the memory cell), the sub-circuits 310A, 320B, and 330B are activated. Consequently, a first conduction path (e.g., 351), extending from the sub-circuit 310A, through the memory cell 103A and sub-circuit 320B, and to ground, and a second conduction path (e.g., 353), extending from the sub-circuit 310A, through the memory cell 103A and sub-circuit 330B, and to ground, can be formed. When writing a logic 1 to the memory cell, the sub-circuits 310B, 320A, and 330A are activated. Consequently, a first conduction path (e.g., 371), extending from the sub-circuit 310B, through the memory cell 103A and sub-circuit 320A, and to ground, and a second conduction path (e.g., 373), extending from the sub-circuit 310B, through the memory cell 103A and sub-circuit 330A, and to ground, can be formed.

In one aspect of the present disclosure, a memory circuit is disclosed. The memory circuit includes a memory array comprising a plurality of non-volatile memory cells, wherein the non-volatile memory cells are arranged along a plurality of access lines that extend along a lateral direction. The memory circuit includes a first access circuit physically disposed on a first side of the memory array in the lateral direction. The memory circuit includes a second access circuit physically disposed on a second side of the memory array in the lateral direction, the second side being opposite to the first side. When each of the non-volatile memory cells is configured to be programmed by at least a first current and a second current, the first current and second current flow through a first path and a second path, respectively. The first path at least comprises a portion on the first side and the second path at least comprises a portion on the second side.

In another aspect of the present disclosure, a memory circuit is disclosed. The memory circuit includes a plurality of non-volatile memory cells arranged over a plurality of bit lines that extend along a lateral direction. The memory circuit includes a first access circuit physically disposed on a first side of the non-volatile memory cells in the lateral direction, wherein the first access circuit comprises a first sub-circuit and a second sub-circuit. The memory circuit includes a second access circuit physically disposed on a second side of the non-volatile memory cells in the lateral direction, the second side being opposite to the first side, wherein the second access circuit comprises a third sub-circuit and a fourth sub-circuit. The first sub-circuit is configured to couple a programming voltage to a corresponding one of the plurality of non-volatile memory cells and the second and fourth sub-circuits are each configured to complement a conduction path from the programming voltage to ground, when programming a first logic state to the corresponding non-volatile memory cell. The second sub-circuit is configured to couple the programming voltage to the corresponding non-volatile memory cell and the first and third sub-circuits are each configured to complement another conduction path from the programming voltage to the ground, when programming a second logic state to the corresponding non-volatile memory cell.

In yet another aspect of the present disclosure, a method for operating a memory circuit is disclosed. The method includes activating (i) a first access circuit physically disposed on a first side of a non-volatile memory cell; (ii) a second access circuit physically disposed on the first side of the non-volatile memory cell; and (iii) a third access circuit physically disposed on a second side of the non-volatile memory cell. The method includes providing a voltage to the non-volatile memory cell. The method includes conducting a first current flowing through a first conduction path that extends from the voltage, through the first access circuit, the non-volatile memory cell, and the second access circuit, and to ground. The method includes conducting a second current flowing through a second conduction path that extends from the programming voltage, through the first access circuit, the non-volatile memory cell, and the third access circuit, and to ground.

As used herein, the terms "about" and "approximately" generally indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory circuit, comprising:
a memory array comprising a plurality of non-volatile memory cells, wherein the non-volatile memory cells are arranged along a plurality of access lines that extend along a lateral direction;
a first access circuit physically disposed on a first side of the memory array in the lateral direction; and
a second access circuit physically disposed on a second side of the memory array in the lateral direction, the second side being opposite to the first side;
wherein when each of the non-volatile memory cells is configured to be programmed by at least a first current and a second current, the first current and second current flow through a first path and a second path, respectively, and wherein the first path at least comprises a portion on the first side and the second path at least comprises a portion on the second side.

2. The memory circuit of claim 1, wherein each of the non-volatile memory cells comprises a magnetic tunnel junction (MTJ) element.

3. The memory circuit of claim 1, wherein the first access circuit comprises a first sub-circuit and a second sub-circuit, and the second access circuit comprises a third sub-circuit, and wherein the first sub-circuit and the second sub-circuit operatively form a portion of the first path, and the first sub-circuit and the third sub-circuit operatively form a portion of the second path.

4. The memory circuit of claim 3, wherein the first sub-circuit is configured to couple a programming voltage through a corresponding one of the access lines to a corresponding one of the non-volatile memory cells, while the second sub-circuit and the third sub-circuit are configured to couple the first path and the second path to ground, respectively.

5. The memory circuit of claim 1, wherein the first access circuit comprises a first sub-circuit, and the second access circuit comprises a second sub-circuit and a third sub-circuit, and wherein the first sub-circuit and the third sub-circuit operatively form a portion of the first path, and the second sub-circuit and the third sub-circuit operatively form a portion of the second path.

6. The memory circuit of claim 5, wherein the first sub-circuit and the second sub-circuit are each configured to couple a programming voltage through a corresponding one of the access lines to a corresponding one of the non-volatile memory cells, while the third sub-circuit is configured to couple the first path and the second path to ground.

7. The memory circuit of claim 1, wherein the first access circuit comprises a first sub-circuit and a second sub-circuit, and the second access circuit comprises a third sub-circuit, and wherein the first sub-circuit and the second sub-circuit operatively form a portion of the first path, and the third sub-circuit and the second sub-circuit operatively form a portion of the second path.

8. The memory circuit of claim 7, wherein the first sub-circuit and the third sub-circuit are each configured to couple a programming voltage through a corresponding one of the access lines to a corresponding one of the non-volatile memory cells, while the second sub-circuit is configured to couple the first path and the second path to ground.

9. The memory circuit of claim 1, wherein the first access circuit comprises a first sub-circuit and a second sub-circuit, and the second access circuit comprises a third sub-circuit and a fourth sub-circuit, and wherein the first sub-circuit and the second sub-circuit operatively form a portion of the first path, and the third sub-circuit and the fourth sub-circuit operatively form a portion of the second path.

10. The memory circuit of claim 9, wherein the first sub-circuit and the third sub-circuit are each configured to couple a programming voltage through a corresponding one of the access lines to a corresponding one of the non-volatile memory cells, while the second sub-circuit and the fourth sub-circuit are configured to couple the first path and the second path to ground, respectively.

11. The memory circuit of claim 1, wherein the first path and the second path both extend from the first or second side, both extend through a corresponding one of the non-volatile memory cells, and then separate toward the first side and the second side, respectively.

12. The memory circuit of claim 1, wherein the first path and the second path extend from the first side and the second side, respectively, both extend through a corresponding one of the non-volatile memory cells, and then both extend toward the first or second side.

13. The memory circuit of claim 1, wherein the first current and the second current have a same direction, and the direction is configured to determine a logic state programmed into a corresponding one of the non-volatile memory cells.

14. A memory circuit, comprising:
a plurality of non-volatile memory cells arranged over a plurality of bit lines that extend along a lateral direction;
a first access circuit physically disposed on a first side of the non-volatile memory cells in the lateral direction, wherein the first access circuit comprises a first sub-circuit and a second sub-circuit; and
a second access circuit physically disposed on a second side of the non-volatile memory cells in the lateral direction, the second side being opposite to the first side, wherein the second access circuit comprises a third sub-circuit and a fourth sub-circuit;
wherein the first sub-circuit is configured to couple a programming voltage to a corresponding one of the plurality of non-volatile memory cells and the second and fourth sub-circuits are each configured to complement a conduction path from the programming voltage to ground, when programming a first logic state to the corresponding non-volatile memory cell; and wherein the second sub-circuit is configured to couple the programming voltage to the corresponding non-volatile memory cell and the first and third sub-circuits are each configured to complement another conduction path from the programming voltage to the ground, when programming a second logic state to the corresponding non-volatile memory cell.

15. The memory circuit of claim 14, wherein each of the non-volatile memory cells comprises a magnetic tunnel junction (MTJ) element.

16. The memory circuit of claim 14, wherein the first sub-circuit and the second sub-circuit each include one or more first switches coupled between a corresponding one of the bit lines and the corresponding non-volatile memory cell.

17. The memory circuit of claim 16, wherein the first sub-circuit and the second sub-circuit each include one or more second switches coupled between the corresponding non-volatile memory cell and ground.

18. The memory circuit of claim 17, wherein the third sub-circuit and the fourth sub-circuit each include one or more third switches coupled between the corresponding non-volatile memory cell and ground.

19. A method for operating a memory circuit, comprising:
activating (i) a first access circuit physically disposed on a first side of a non-volatile memory cell; (ii) a second access circuit physically disposed on the first side of the non-volatile memory cell; and (iii) a third access circuit physically disposed on a second side of the non-volatile memory cell;
providing a voltage to the non-volatile memory cell;
conducting a first current flowing through a first conduction path that extends from the voltage, through the first access circuit, the non-volatile memory cell, and the second access circuit, and to ground; and
conducting a second current flowing through a second conduction path that extends from the programming voltage, through the first access circuit, the non-volatile memory cell, and the third access circuit, and to ground.

20. The method of claim 19, wherein the non-volatile memory cell comprises a magnetic tunnel junction (MTJ) element.

* * * * *